(12) United States Patent
Shimamoto et al.

(10) Patent No.: US 10,163,910 B2
(45) Date of Patent: Dec. 25, 2018

(54) METHOD OF MANUFACTURING SEMICONDUCTOR DEVICE

(71) Applicant: HITACHI KOKUSAI ELECTRIC INC., Tokyo (JP)

(72) Inventors: Satoshi Shimamoto, Toyama (JP); Atsushi Moriya, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/679,366

(22) Filed: Aug. 17, 2017

(65) Prior Publication Data

US 2018/0090502 A1   Mar. 29, 2018

(30) Foreign Application Priority Data

Sep. 28, 2016 (JP) .................. 2016-189641

(51) Int. Cl.
*H01L 27/108* (2006.01)
*H01L 21/02* (2006.01)
*H01L 21/3115* (2006.01)
*H01L 21/66* (2006.01)

(52) U.S. Cl.
CPC .... *H01L 27/10894* (2013.01); *H01L 21/0223* (2013.01); *H01L 21/3115* (2013.01); *H01L 22/20* (2013.01); *H01L 27/10823* (2013.01); *H01L 27/10876* (2013.01); *H01L 27/10891* (2013.01); *H01L 27/10855* (2013.01)

(58) Field of Classification Search
CPC ........... H01L 27/10894; H01L 21/0223; H01L 21/3115
See application file for complete search history.

(56) References Cited

U.S. PATENT DOCUMENTS 6,033,921 A    3/2000   Dawson et al.
2011/0233662 A1   9/2011   Mikasa
(Continued)

FOREIGN PATENT DOCUMENTS

JP    3270250 B2    4/2002
JP    4024935 B2    12/2007
(Continued)

OTHER PUBLICATIONS

Korean Office Action dated Aug. 29, 2018 for the Korean Patent Application No. 10-2017-0098113.

*Primary Examiner* — Errol Fernandes
(74) *Attorney, Agent, or Firm* — Volpe and Koenig, P.C.

(57) ABSTRACT

Described herein is a technique capable of suppressing the deviation in the characteristic of the semiconductor device. A method of manufacturing a semiconductor device may include: (a) receiving a data obtained by measuring a width of a first pillar between first grooves in a center region of a substrate and a width of a second pillar between second grooves in a peripheral region of the substrate; and (b) forming a width adjusting film on surfaces of the first grooves and the second grooves such that a sum of the width of the first pillar and a thickness of a first portion of the width adjusting film in the center region and a sum of the width of the second pillar and a thickness of a second portion of the width adjusting film in the peripheral region are within a predetermined range.

13 Claims, 19 Drawing Sheets

(56) References Cited

U.S. PATENT DOCUMENTS

| | | | |
|---|---|---|---|
| 2011/0278650 A1* | 11/2011 | Tamaki | H01L 29/66681 257/288 |
| 2013/0019894 A1 | 1/2013 | Kudou et al. | |
| 2013/0221427 A1* | 8/2013 | Siemieniec | H01L 29/407 257/330 |
| 2014/0117442 A1* | 5/2014 | Lee | H01L 21/823456 257/334 |
| 2016/0079350 A1* | 3/2016 | Ohta | H01L 29/0634 257/330 |
| 2016/0093512 A1 | 3/2016 | Suda et al. | |

FOREIGN PATENT DOCUMENTS

| | | |
|---|---|---|
| JP | 4431401 B2 | 3/2010 |
| JP | 4445212 B2 | 4/2010 |
| JP | 2011-205030 A | 10/2011 |
| JP | 2013-026399 A | 2/2013 |
| JP | 2014-216327 | 11/2014 |
| JP | 2015-079865 | 4/2015 |
| KR | 20160038688 A | 4/2016 |

\* cited by examiner

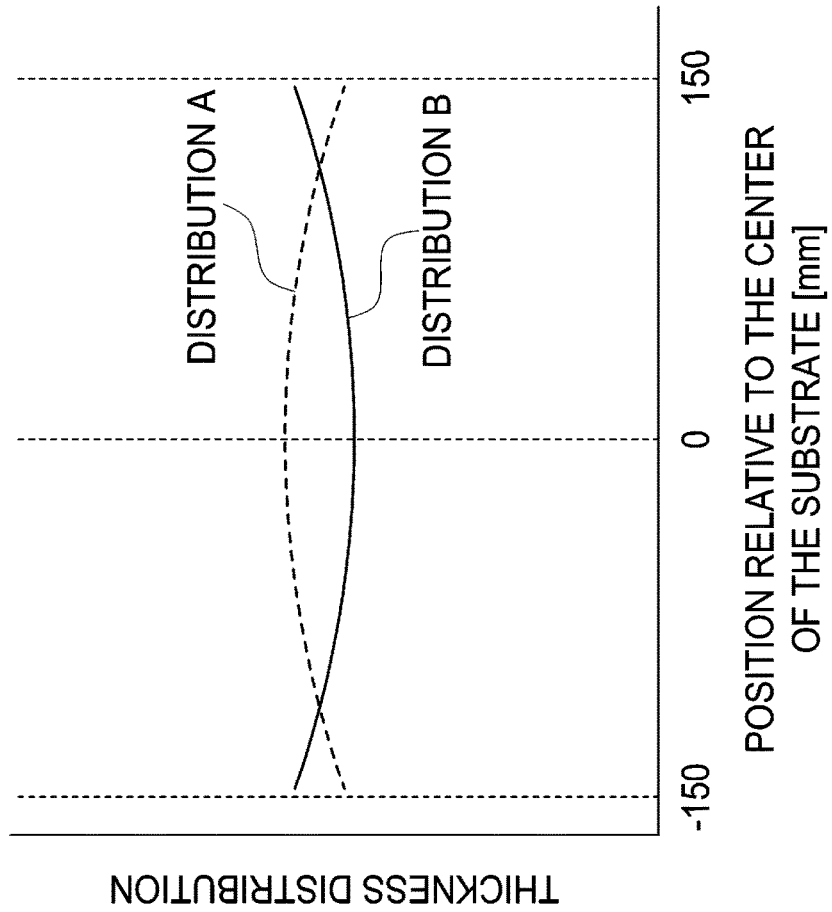

METHOD OF MANUFACTURING SEMICONDUCTOR DEVICE

CROSS-REFERENCE TO RELATED PATENT APPLICATION

This U.S. non-provisional patent application claims priority under 35 U.S.C. § 119 of Japanese Patent Application No. 2016-189641, filed on Sep. 28, 2016, in the Japanese Patent Office, the entire contents of which are hereby incorporated by reference.

BACKGROUND

1. Field

The present disclosure relates to a method of manufacturing a semiconductor device.

2. Description of the Related Art

Recently, semiconductor devices are integrated at high density. As a result, the size of a pattern is remarkably miniaturized. The pattern is formed by performing processes such as formation of a hard mask or a photoresist film, a lithography process and an etching process. The pattern should be formed without causing any deviations in characteristics of the semiconductor device.

Meanwhile, due to a problem in processing, deviations may occur in a width of the pattern such as a circuit formed in the semiconductor device. In particular, the characteristic of the semiconductor device is significantly affected by the deviations in the miniaturized semiconductor device. Therefore, the deviations occur, the yield may be degraded.

SUMMARY

Described herein is a technique capable of suppressing the deviation in the characteristic of the semiconductor device.

According to one aspect of the technique described herein, a method of manufacturing a semiconductor device may include: (a) receiving a data obtained by measuring a width of a first pillar between first grooves in a center region of a substrate and a width of a second pillar between second grooves in a peripheral region of the substrate; and (b) forming a width adjusting film on surfaces of the first grooves and the second grooves such that a sum of the width of the first pillar and a thickness of a first portion of the width adjusting film in the center region and a sum of the width of the second pillar and a thickness of a second portion of the width adjusting film in the peripheral region are within a predetermined range.

BRIEF DESCRIPTION OF THE DRAWINGS

FIG. 4 illustrates a thickness distribution of the hard mask according to the embodiment.

DETAILED DESCRIPTION

Embodiment

Hereinafter, an embodiment will be described.

Figure 1:
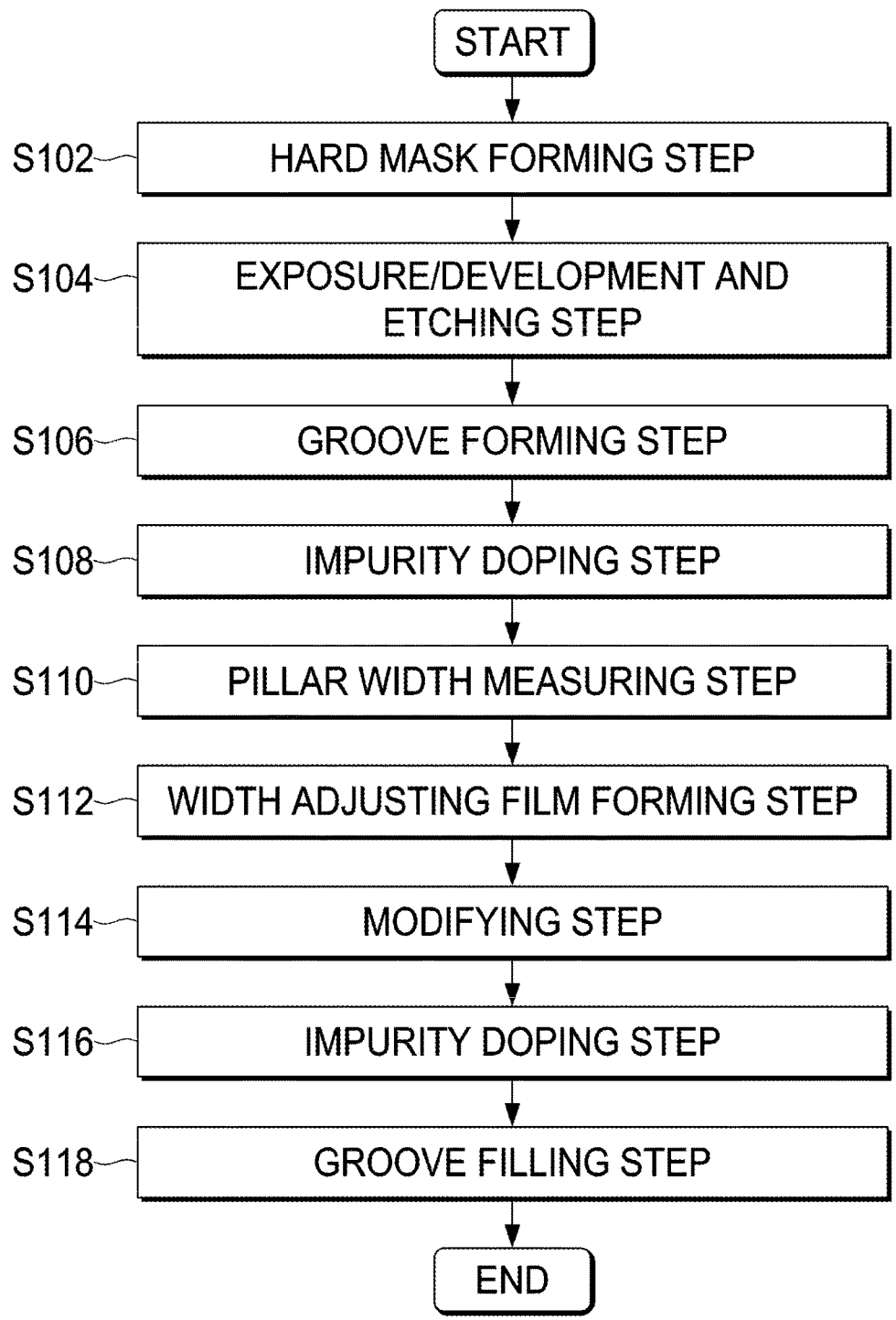
FIG. 1 illustrates a flow of manufacturing method of a semiconductor device according to an embodiment.

Processing steps of a manufacturing process of a semiconductor device will be described with reference to FIG. 1. A DRAM (Dynamic Random Access Memory) may be manufactured by the steps shown in FIG. 1. The flow and the structure of the semiconductor device will be described below in detail.

Figure 17:
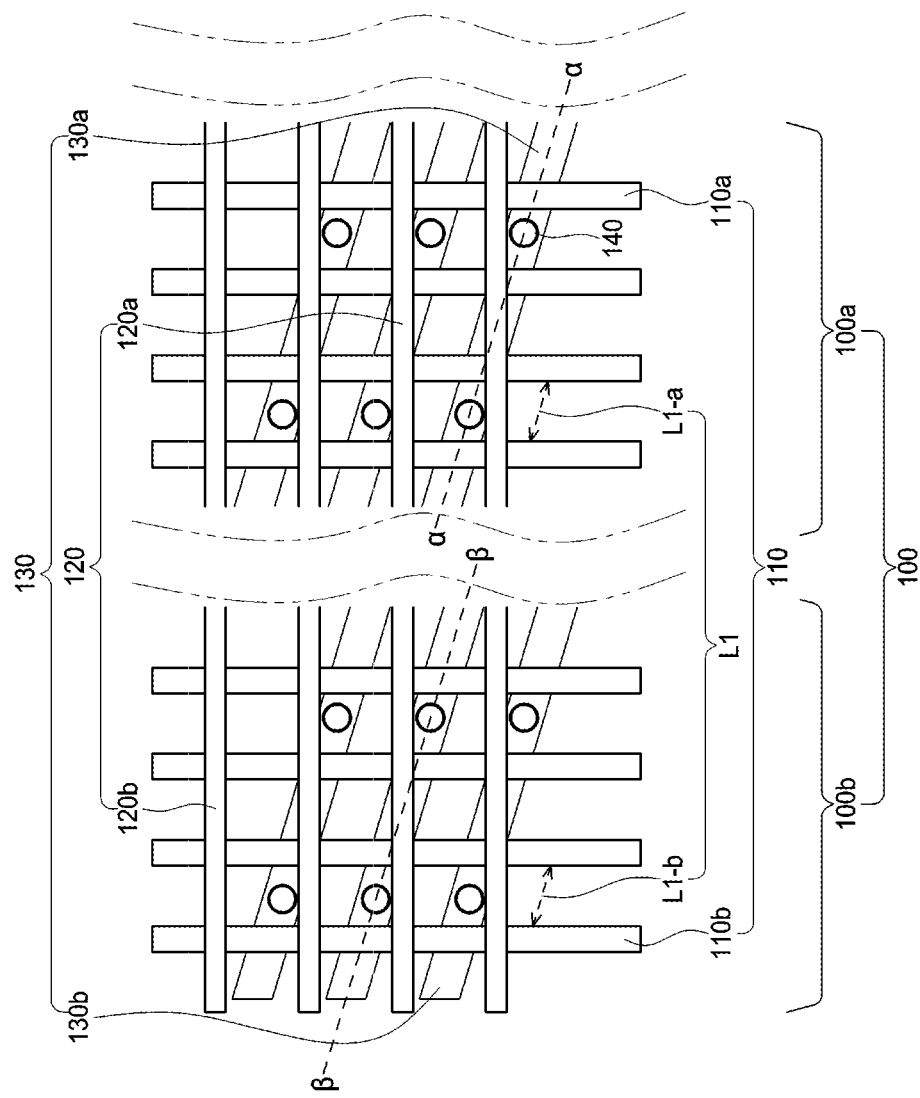
FIG. 17 illustrates a plan view a wafer according to a comparative example.
Figure 18:
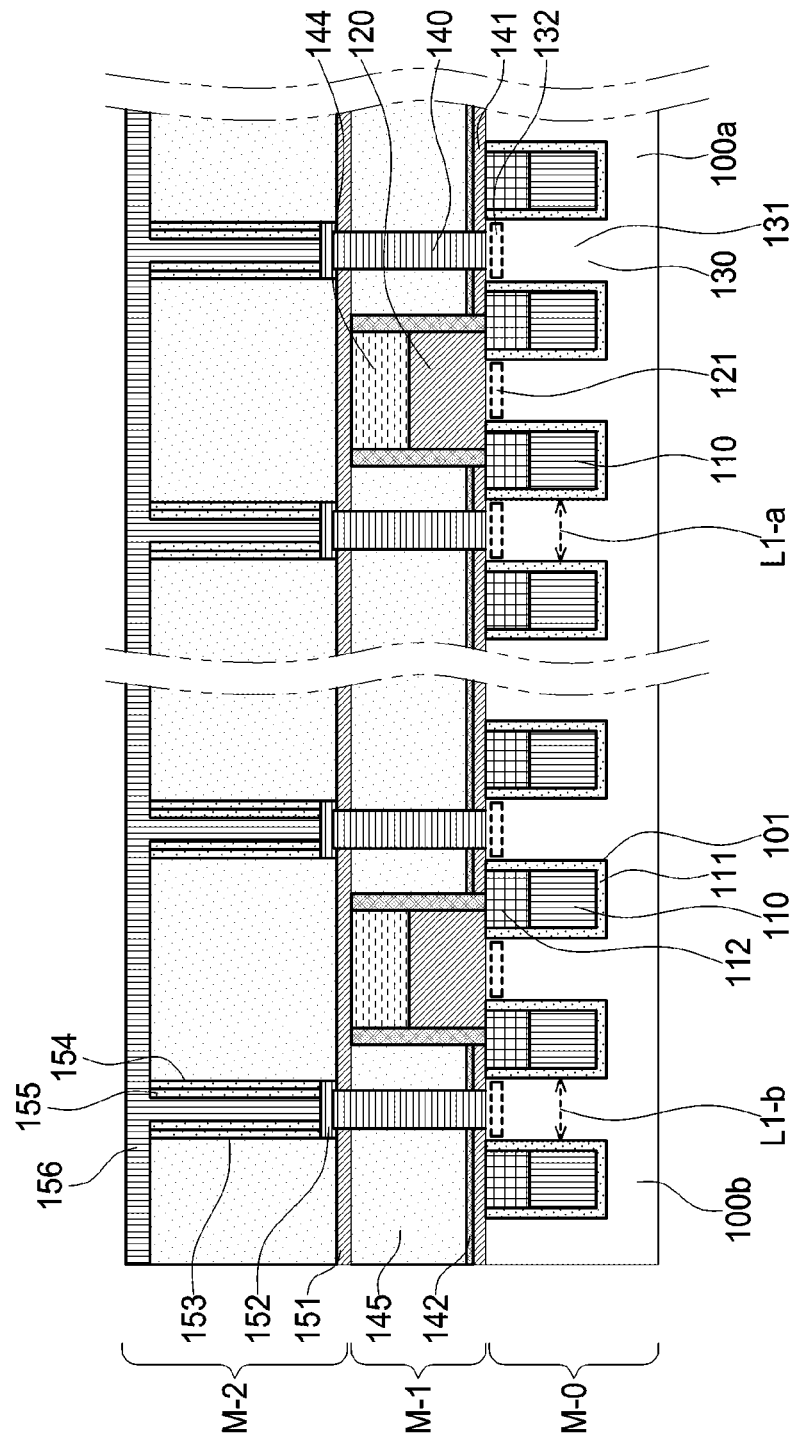
FIG. 18 illustrates a cross-section of the wafer according to the comparative example.

First, the structure of a general semiconductor device will be described with reference to FIGS. 17 and 18 as a comparative example. FIG. 17 is a plan view of a memory cell, and FIG. 18 illustrates a cross-section of the structure of the semiconductor device taken along the lines α-α and β-β of FIG. 17 after the formation of the capacitor is completed. For convenience of description, only main wiring structure is shown in FIG. 17, and a portion of the structure shown in FIG. 18 is omitted in FIG. 17.

FIG. 17 illustrates a group of wiring in a center region 100a of a wafer 100 and a group of wiring in a peripheral region 100b which is the periphery of the center region 100a. Word-lines 110 and bit-lines 120 intersecting the word-lines 110 are formed on the wafer 100. The word-lines 110 and the bit-lines 120 are electrically connected to each other.

Contact plugs 140 are connected to a portion of an active region 130. The word-lines 110, the bit-lines 120 and the active region 130 in the center region 100a are referred to as word-lines 110a, bit-lines 120a and active region 130a, respectively. Similarly, the word-lines 110, the bit-lines 120 and the active region 130 in the peripheral region 100b are referred to as word-lines 110b, bit-lines 120b, and active region 130b, respectively.

The distance between the two adjacent word-lines 110a in the center region 100a is [L1-a], and the distance between the two adjacent word-lines 110b in the peripheral region 100b is [L1-b].

FIG. 18 is a cross-sectional view taken along the lines α-α and β-β of FIG. 17. The word-lines 110 which are a metal film and an insulating film 111 insulating the word-lines 110 from the wafer 100 are provided in grooves 101 formed in the wafer 100. A cap insulating film 112 is formed on the word-lines 110 in the grooves 101.

The pillar 131 provided between the two adjacent grooves 101 constitutes the active region 130. A plug contact region 132 is provided on the pillar 131. The plug contact region 132 is also referred to as first plug contact region 132 or contact surface. The plug contact region 132 is doped with impurities. A contact plug 140 is connected to the plug contact region 132. The width of the pillar 131 in the center region 100a is [L1-a] and the width of the pillar 131 in the peripheral region 100b is [L1-b].

The bit-line contact region 121 is provided between the two adjacent grooves 101 other than where the pillar 131 is provided. The bit-line contact region 121 is doped with impurities. The bit-line 120 is connected to the bit-line contact region 121. In this embodiment, the above-described structures formed on the wafer 100 are collectively referred to as "0$^{th}$ layer" or "layer M-0".

An interlayer insulating film 141 is formed on the wafer 100. A liner insulating film 142 is formed on the interlayer insulating film 141 to surround the bit-lines 120 on the interlayer insulating film 141. A cover insulating film 144 is formed on the bit-lines 120. An interwiring insulating films 145 is formed between the bit-lines 120 and contact plugs 140 to isolate the bit-lines 120 from the contact plugs 140. In this embodiment, the layers formed on the layer M-0, i.e., from the interlayer insulating film 141 to the interwiring insulating film 145, are collectively referred to as "1$^{st}$ layer" or "layer M-1".

An interlayer insulating film 151 is formed on the cover insulating film 144 and the interlayer insulating film 145. The contact plug 140 penetrates the interlayer insulating film 151. A contact pad 152 is installed on the contact plug 140. A cylindrical pole 153 is provided on the contact pad 152. A lower electrode 154, a capacitor insulating film 155 and an upper electrode 156 are formed in order from on the surface of the cylindrical pole 153. In this embodiment, the layers formed on the layer M-1, i.e., the interlayer insulating film 151 to the upper electrode 156 are collectively referred to as "2$^{nd}$ layer" or "layer M-2".

In order to improve the yield, the area of the plug contact region 132 of the semiconductor device of the above-described structure is preferably within a predetermined range. The contact resistance value is depends upon the area of the plug contact region 132. Therefore, when there is a deviation in the area of the plug contact region 132, the resistance value also deviates. As a result, characteristics such as the amount of current flowing through the contact plug deviate. Thus, it is preferable that the area of the plug contact region 132 is selected to be within a predetermined range such that the deviation in the area of the plug contact region 132 does not to affect the product.

However, when the semiconductor device manufactured, the width of the pillar 131 in the peripheral region 100a may differ from that of the pillar 131 in the peripheral region 100b. Since the area of the plug contact region 132 is proportional to the width of the pillar 131, the area of the plug contact region 132 in the center region 100a differs from that of the plug contact region 132 in the center region 100a in the peripheral region 100b. As a result, the yield may be degraded. According to the embodiment, a technique for manufacturing a semiconductor device without the degradation of the yield while maintaining the area of the plug contact region within a predetermined range.

Hereinafter, the embodiment will be described with reference to FIGS. 1 through 16. First, the formation of the layer M-0 will be mainly described.

<Hard Mask Forming Step S102>

Figure 2:
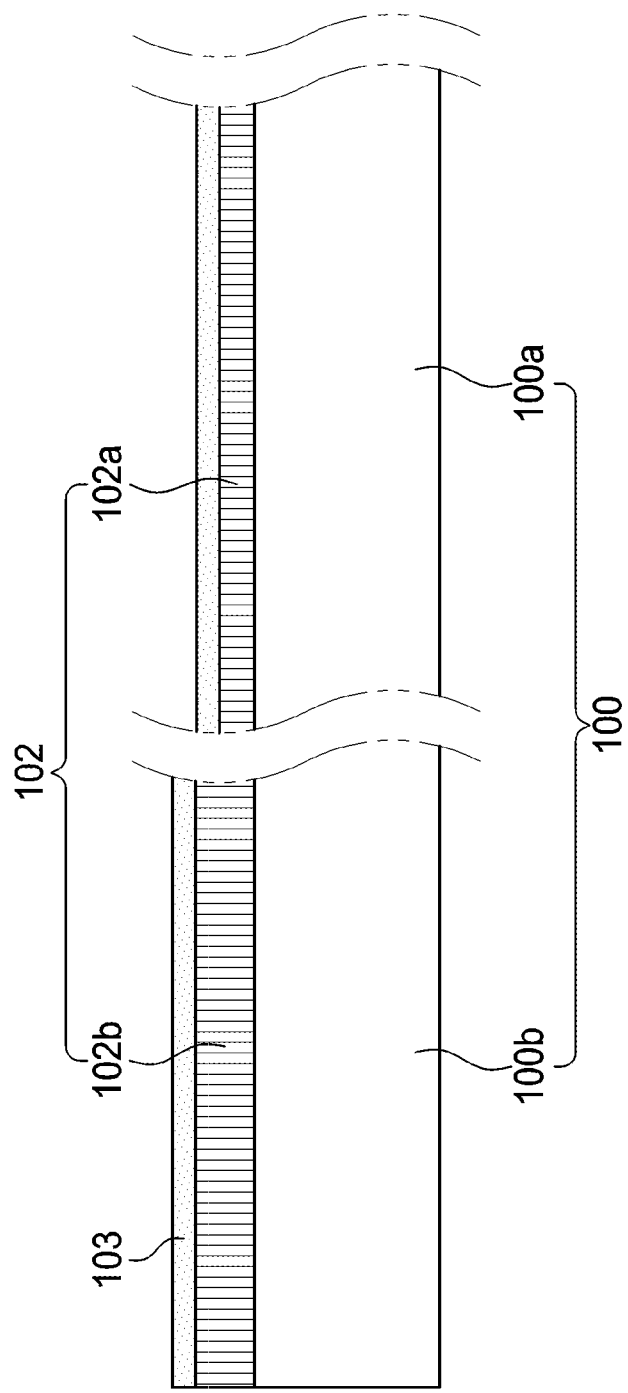
FIG. 2 illustrates a cross-section of a wafer having thereon a hard mask and a photoresist film according to the embodiment FIG. 3 schematically illustrates a hard mask forming apparatus according to the embodiment.
Figure 3:
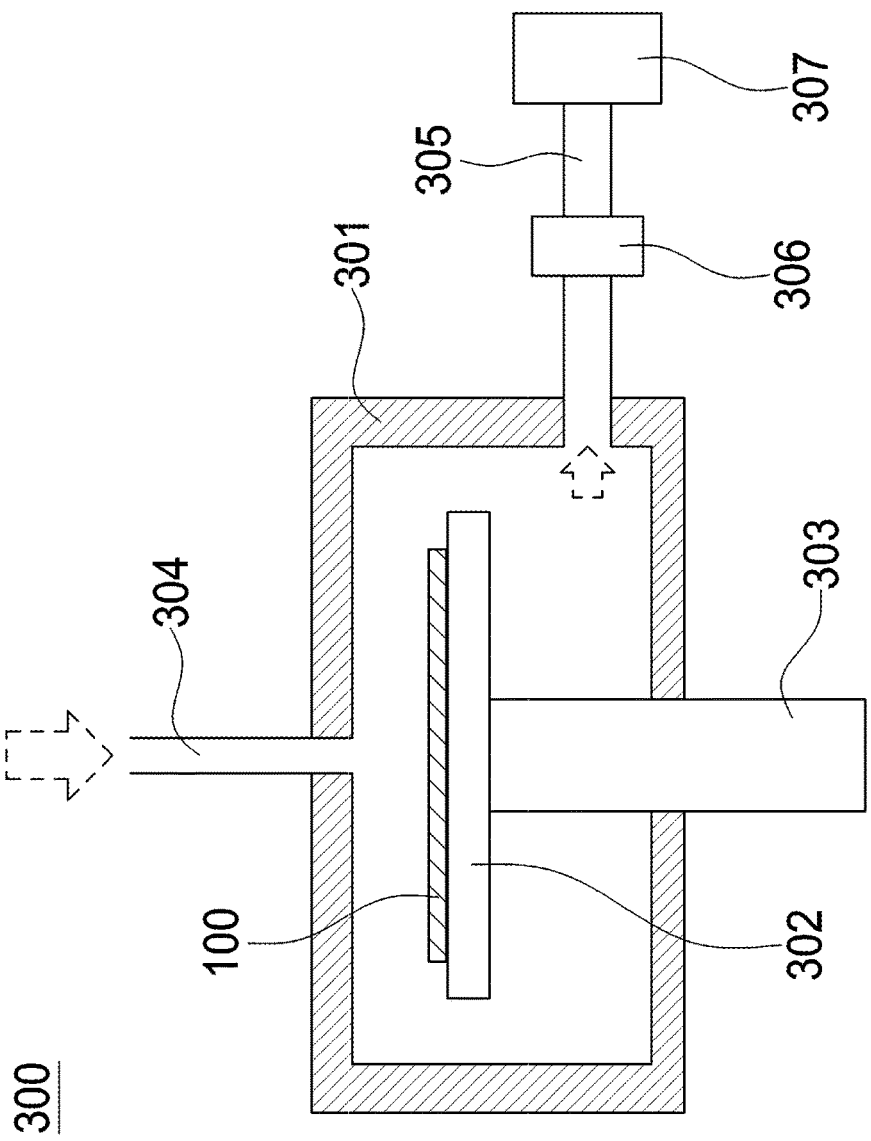

The hard mask forming step S102 shown in FIG. 1 will be described with reference to FIGS. 2, 3 and 4. As shown in FIG. 2, a hard mask 102 is formed on the wafer 100. The hard mask 102 is formed using a hard mask forming apparatus shown in FIG. 3. For example, a silicon nitride (SiN) film is used as the hard mask 102. A photoresist 103 is formed on the hard mask 102 using a photoresist forming apparatus (not shown).

The thickness of the hard mask 102 in the center region 100a of the wafer 100 may differ from the thickness of the hard mask 102 in the peripheral region 100b. As generally known, the difference between the thickness of the hard mask 102a in the center region 100a and the thickness of the hard mask 102b in the peripheral region 100b is generated due to the structure or the deterioration of the hard mask forming apparatus used for forming the hard mask 102.

Hereinafter, an exemplary hard mask forming apparatus 300 will be described with reference to FIG. 3. FIG. 3 depicts a typical single wafer type hard mask forming apparatus 300. The hard mask forming apparatus 300 includes a housing 301. A substrate support unit 302 is provided in the housing 301 and is supported by a shaft 303. In order to form the hard mask 102, the wafer 100 is placed on the substrate support unit 302. A gas supply pipe 304 is provided on the ceiling of the housing 301 above the substrate support unit 302. A gas source (not shown) for forming the hard mask is connected to the gas supply pipe 304. A gas supply control unit (not shown) including a valve and a mass flow controller are provided at the gas supply pipe 304. The gas supply control unit is configured to control the gas supply into the housing 301. An exhaust pipe 305 is connected to the sidewall of the housing 301. The exhaust pipe 305 is provided lower the substrate support unit 302, for example. An APC 306 (Automatic Pressure Controller) for adjusting an inner pressure of the housing 301 is provided at the exhaust pipe 305. The exhaust pipe 305 is connected to an exhaust pump 307. The amount of gas exhausted from the housing 301 is regulated by the APC 306 and the exhaust pump 307.

When components such as the APC 306 fail or deteriorate, the inner pressure of the housing 301 or the flow rate of the gas supplied into the housing 301 will differ from an initial preset value. In order to uniformly process the surface of the wafer 100, the initial preset value is set such that the hard mask on the surface of the wafer 100 has uniform thickness. However, when the inner pressure of the housing 301 or the flow rate of the gas supplied into the housing 301 differs from the initial preset value, the hard mask formed on the wafer 100 does not have uniform thickness. Specifically, the hard mask formed on the wafer 100 has an exemplary thickness distribution shown in FIG. 4. For example, when the inner pressure is lower than the initial preset value, a convex hard mask which is thicker in the central region 100a and thinner in the peripheral region 100a is formed according to distribution A. On the other hand, when the inner pressure is higher than the initial preset value, a concave hard mask which is thinner in the central region 100a and thicker in the peripheral region 100a is formed according to distribution B.

<Exposure/Development and Etching Step S104>

Figure 5A:
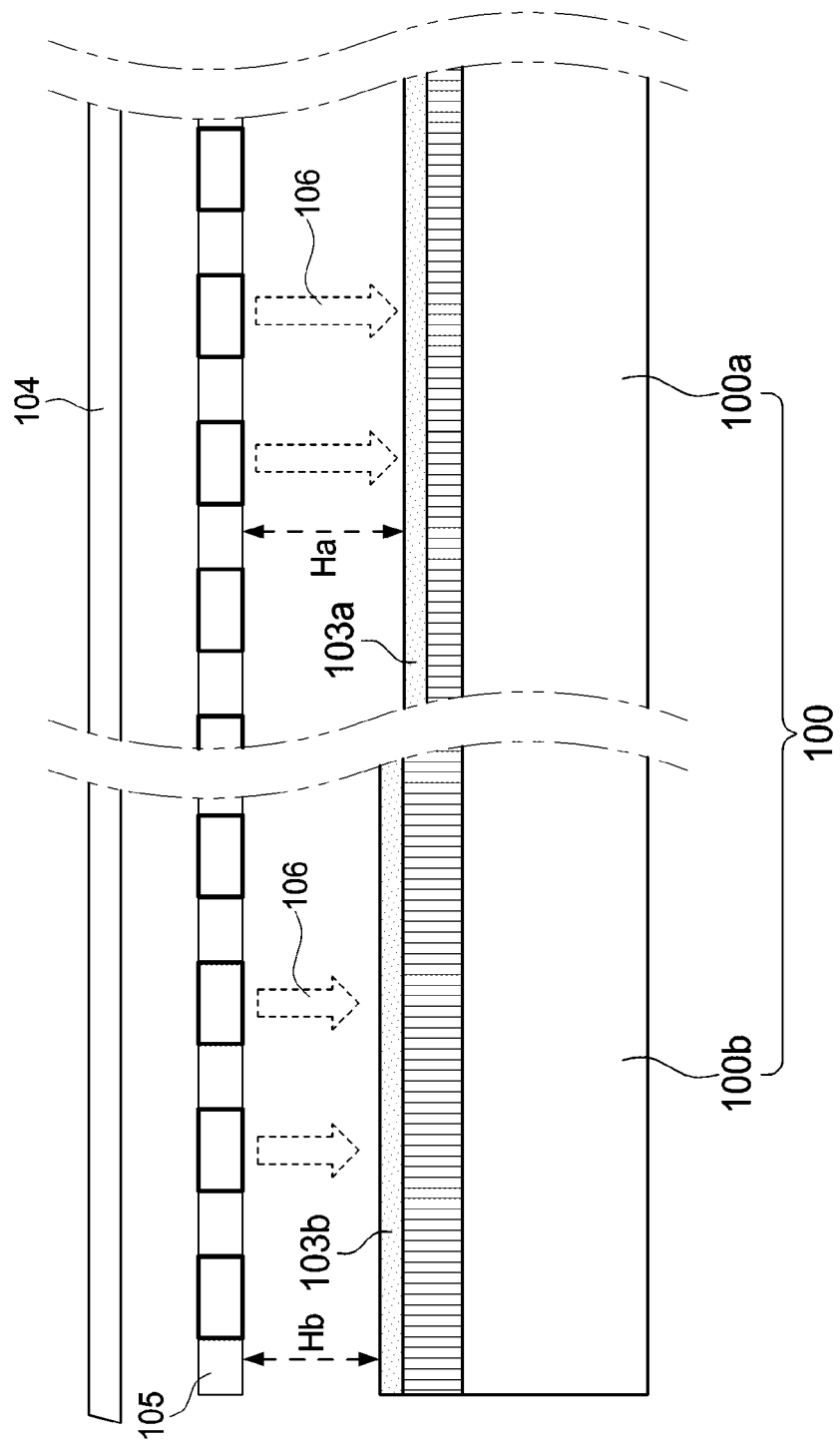
FIGS. 5A and 5B illustrate a processing of the wafer having thereon a photoresist film pattern according to the embodiment.
Figure 5B:
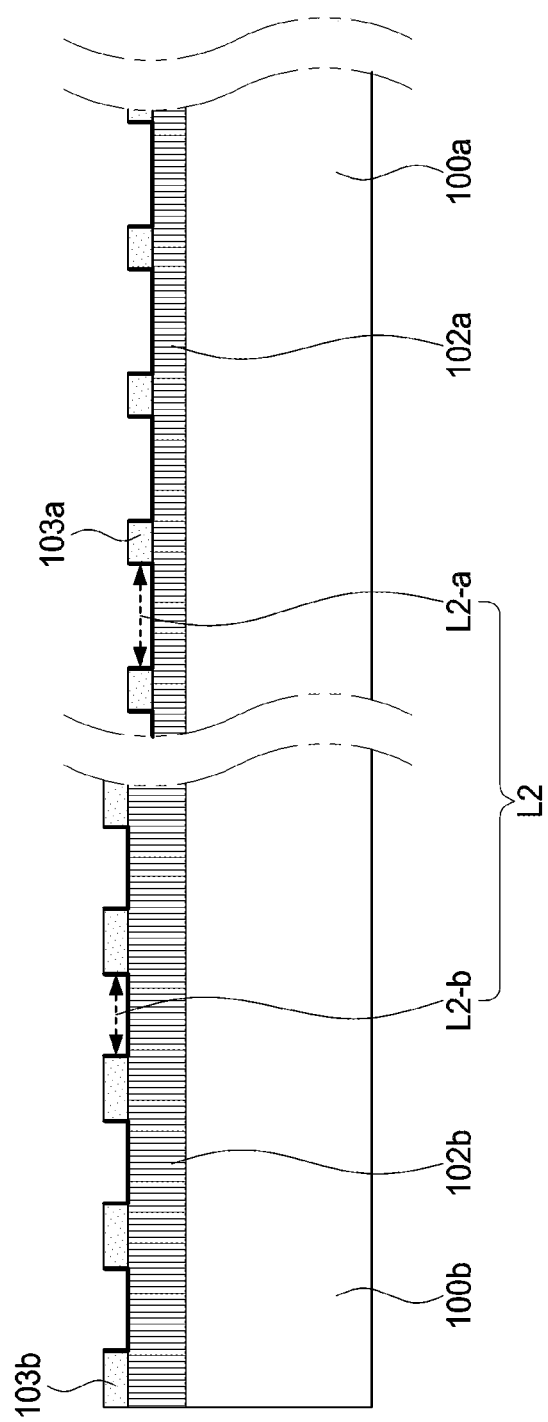
Figure 6:
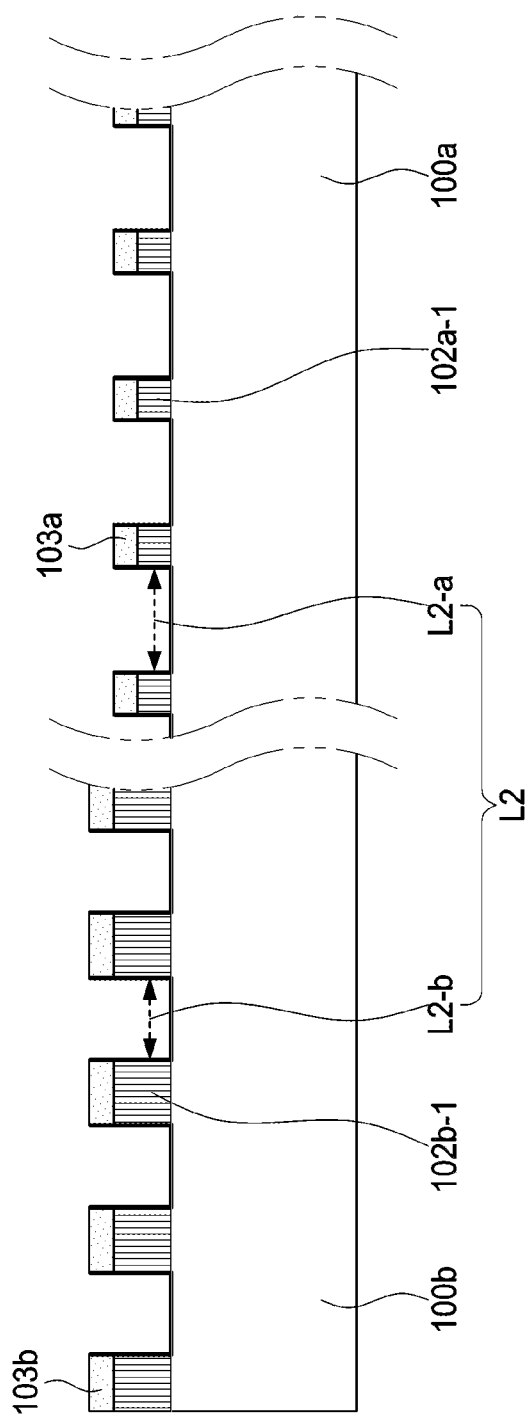
FIG. 6 illustrates a cross-section of the wafer having thereon a photoresist film pattern and a hard mask pattern according to the embodiment.

Next, an exposure/development and etching step S104 will be described. After the photoresist 103 is formed on the hard mask 102, the wafer 100 is transported to an exposure apparatus (not shown). The exposure apparatus performs an exposure process. As shown in FIG. 5A, a lamp 104 and an exposure mask 105 are used. The light emitted from the lamp 104 is irradiated to the photoresist 103 through the exposure mask 105. When the photoresist 103 is developed, photoresist patterns 103a and 103b shown in FIG. 5B are formed. Thereafter, the wafer 100 is transported to an etching apparatus (not shown), and the wafer 100 is subjected to an etching process to form hard mask patterns 102a-1 and 102a-2 as shown in FIG. 6. The photoresist patterns 103a and 103b are then removed.

Next, an example wherein the wafer 100 having thereon the concave hard mask including relatively thin hard mask pattern 102a-1 in the center region 100a and relatively thick hard mask pattern 102b-1 in the peripheral region 100b is subjected to the exposure process will be described with reference to FIGS. 5 and 6.

In the exposure process, the light 106 from the lamp 104 is irradiated to the photoresist 103 through the exposure mask 105, and photoresist patterns 103a and 103b are formed when developed. Since the photoresist 103 is formed on the convex hard mask according to the distribution A or on the concave hard mask according to the distribution B, a distance Ha from the exposure mask 105 to the photoresist pattern 103a differs from a distance Hb from the exposure mask 105 to the photoresist pattern 103b. Thus, the depth of focus of the light differs in the center region 100a and the peripheral region 100b. As a result, a distance L2-a between the photoresist patterns 103a differs from a distance L2-b between the photoresist patterns 103b. That is, the distance L2-a between the photoresist patterns 103a in the center region 100a is greater than the distance L2-b between the photoresist patterns 103b in the peripheral region 100b.

Thereafter, as shown in FIG. 6, the hard mask patterns 102a-1 and 102b-1 are formed by the etching process. Since the hard mask patterns 102a-1 and 102b-1 are formed according to the photoresist patterns 103a and 103b, a width of the hard mask pattern 102a-1 in the center region 100a differs from that of the hard mask pattern 102b-1. As a result, a groove having a width L2-a is formed in the center region 100a and a groove having a width L2-b is formed in the peripheral region 100b in the groove forming step S106.

<Groove Forming Step S106>

Figure 7:
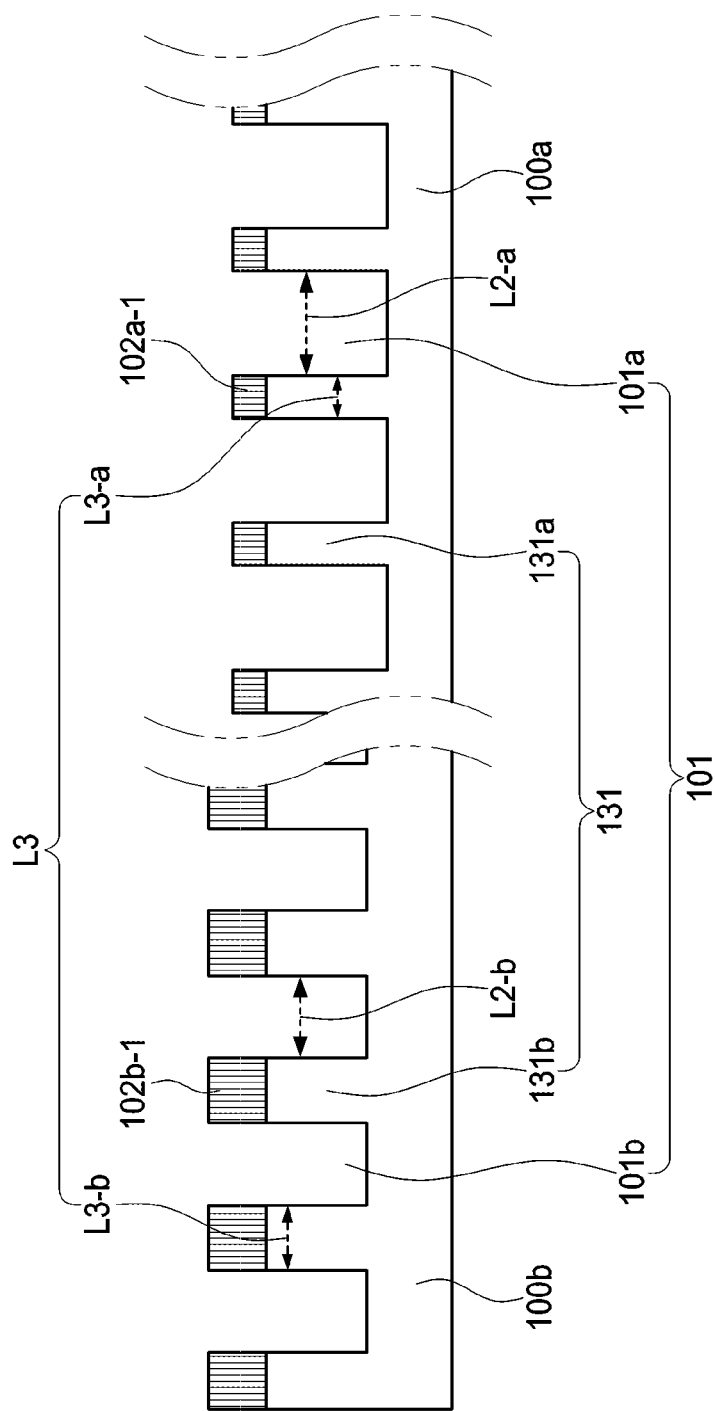
FIG. 7 illustrates a cross-section of the wafer having a trench according to the embodiment

Next, a groove forming step S106 will be described with reference to FIG. 7. The wafer 100 including the hard mask patterns 102a-1 and 102b-1 is transported to the etching apparatus (not shown) and is subjected to an etching process for a predetermined time duration. The grooves 101 are formed on the surface of the wafer 100. When the grooves 101 having a desired depth are formed, the etching process is stopped and the hard mask patterns 102a-1 and 102b-1 are then removed. A groove 101a in the center region 100a of the wafer 100 is wider than a groove 101b in the peripheral region 100b of the wafer 100 due to the influence of the widths of the hard mask patterns 102a-1 and 102b-1. That is, as shown in FIG. 7, a width L2-a of the groove 101a in the center region 100a is greater than a width L2-b of the groove 101b in the peripheral region 100b.

When the widths of the grooves 101 differ as described above, widths of the pillars 131 between the grooves 101 also differs. For example, as shown in to FIG. 7, a width L3-a of a pillar 131a in the center region 100a is smaller than a width L3-b of a pillar 131b in the peripheral region 100b.

Figure 8:
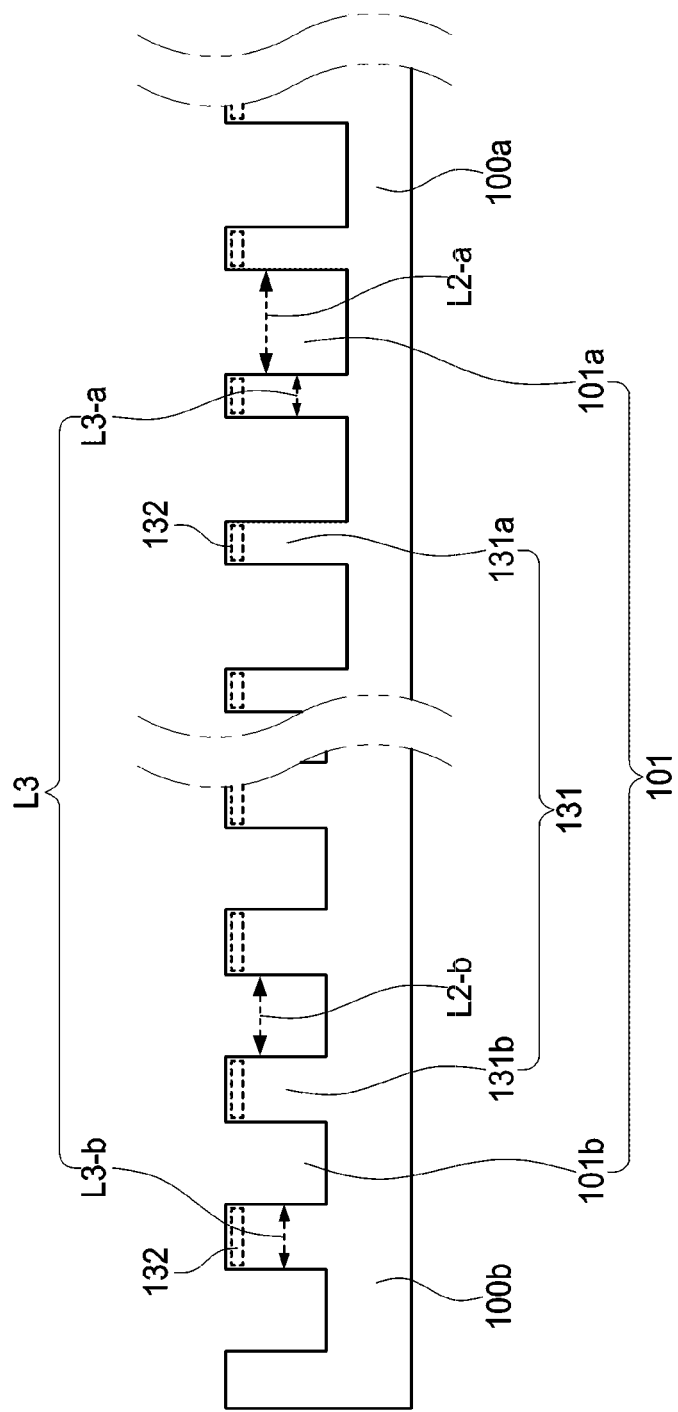
FIG. 8 illustrates a cross-section of the wafer with the hard mask pattern removed according to the embodiment.

As shown in FIG. 8, the hard mask patterns 102a-1 and 102b-1 are removed after grooves 101 having a predetermined depth are formed.

<Impurity Doping Step S108>

Next, an impurity doping step S108 will be described. In the impurity doping step S108, the wafer 100 is transported to an impurity doping apparatus (not shown), and the upper surface of the pillar 131 is doped with impurities such as phosphorus (P) and arsenic (As) to form the plug contact region 132.

<Pillar Width Measuring Step S110>

Figure 9:
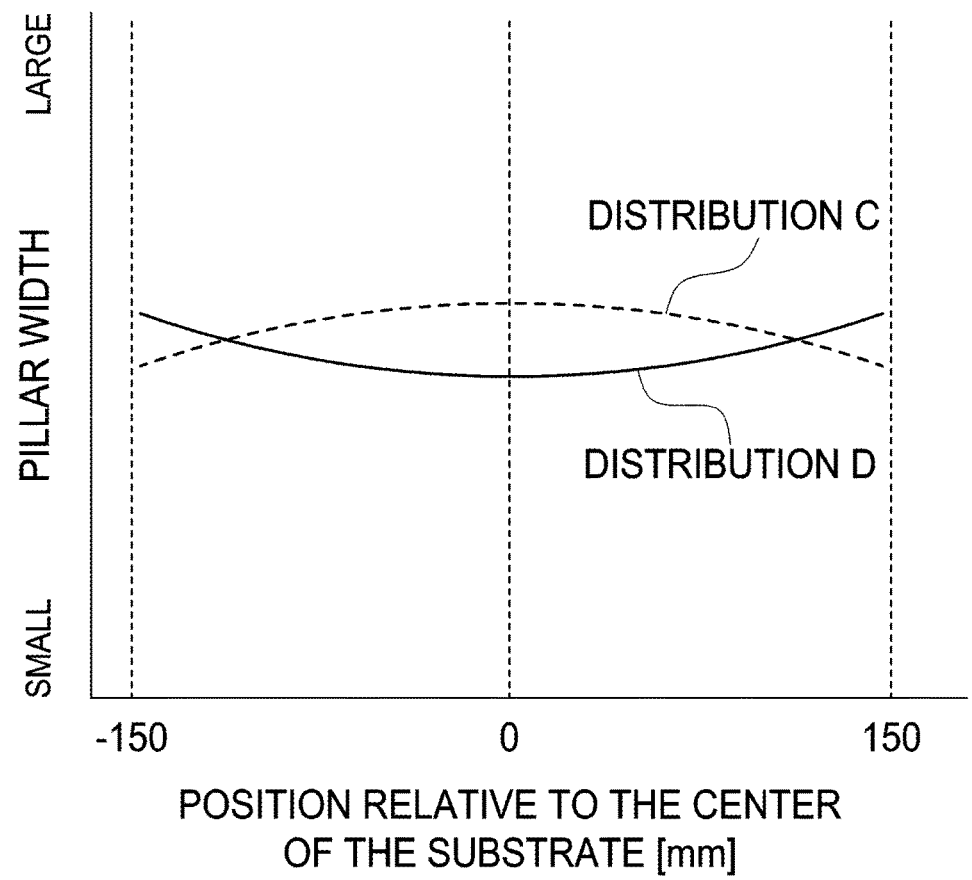
FIG. 9 illustrates a width distribution of a pillar according to the embodiment.

Next, a pillar width measuring step S110 is described. In the pillar width measuring step S110, the wafer 100 is transported to a measuring apparatus (not shown) and the widths L3 of the pillars 131 on the surface of the wafer 100 are measured. Specifically, the width L3-a of the pillar 131a in the center region 100a of the wafer 100 and the width L3-b of the pillar 131b in the peripheral region 100b of the wafer 100 are measured. The measured width has, for example, an exemplary distribution shown in FIG. 9. Referring to FIG. 9, a distribution C represents a relatively large width L3-a of the pillar 131a in the center region 100a and a relatively small width L3-b of the pillar 131b in the peripheral region 100b. That is, the distribution C corresponds to the distribution A of hard mask patterns 102a-1 and 102b-1. A distribution D represents a relatively small width L3-a of the pillar 131a in the center region 100a and a relatively large width L3-b of the pillar 131b in the peripheral region 100b. That is, the distribution D corresponds to the distribution B of hard mask patterns 102a-1 and 102b-1

After the widths L3 of the pillars 131 are measured, the measured widths are transmitted to a substrate processing apparatus 900 which is described later. While the pillar width measuring step S110 is performed after the impurity doping step S108 in the above-described example, the pillar width measuring step S110 may be performed between the groove forming step S106 and the impurity doping step S108.

<Width Adjusting Film Forming Step S112>

Next, a width adjusting film forming step S112 will be described with reference to FIG. 10. As described above, it is preferable that the deviation of the area of the active region 130 formed above the pillar 131 maintained within a predetermined range. However, when the difference between the widths of the pillars 131 is too large, the deviation of the area of the active region 130 may not be maintained within the predetermined range.

Figure 11:
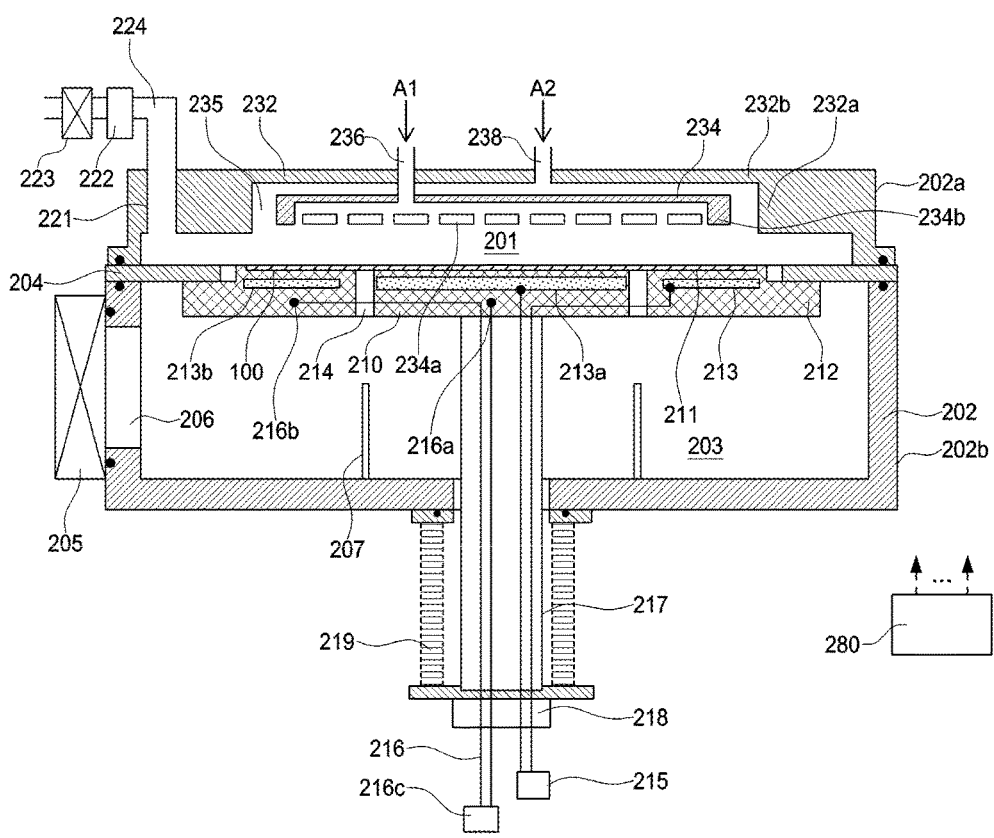
FIG. 11 schematically illustrates a substrate processing apparatus according to the embodiment.

In order to maintain the deviation of the area of the active region 130 at the surface of the wafer 100 within the predetermined range, a width adjusting film 107 is formed on the surface of pillar 113 in the groove 101 in the width adjusting film forming step S112. A width L4 which is the sum of the width L3 of the pillar 131 and a thickness of the width adjusting film 107 may be adjusted by the width adjusting film 107. Hereinafter, the substrate processing apparatus 900 which performs the width adjusting film forming step S112 and an adjustment method using the substrate processing apparatus 900 will be described. The substrate processing apparatus 900 includes a single type substrate processing apparatus as shown in FIG. 11.

<Substrate Processing Apparatus>

The substrate processing apparatus 900 includes a process vessel 202. For example, the process vessel 202 is a flat and sealed vessel having a circular horizontal cross-section. A process chamber 201 where a wafer 100 such as a silicon wafer is processed and a transfer chamber 203 are provided in the process vessel 202. The process vessel 202 includes an upper vessel 202a and a lower vessel 202b. A partition plate 204 is provided between the upper vessel 202a and the lower vessel 202b. A space above the partition plate 204 surrounded by the upper vessel 202a is referred to as the process chamber 201 and a space under the partition plate surrounded by the lower vessel 202b and is referred to as the transfer chamber 203.

A substrate loading/unloading port 206 is provided on a side surface of the lower vessel 202b adjacent to a gate valve 205. The wafer 100 is moved between a vacuum transfer chamber (not shown) and the transfer chamber 203 through the substrate loading/unloading port 206. Lift pins 207 are provided at the bottom of the lower vessel 202b.

A substrate support unit 210 is provided in the process chamber 201 to support the wafer 100. The substrate support unit 210 includes a substrate support 212 having a substrate placing surface 211 on which the wafer 100 is placed. Preferably, the substrate support unit 210 further includes a heater 213 serving as a heating unit. When the substrate support unit 210 further includes the heater 213 serving as the heating unit, the wafer 100 may be heated by the heater 213. As a result, the quality of films formed on the wafer 100 can be improved.

The substrate support 212 is supported by a shaft 217. The shaft 217 penetrates the bottom of the process vessel 202 and is connected to an elevating mechanism 218 at the outside of the process vessel 202. The wafer 100 placed on the substrate placing surface 211 may be elevated and lowered by elevating and lowering the shaft 217 and the substrate support 212 by the elevating mechanism 218. A bellows 219 covers the lower portion of the shaft 217 to maintain the inside of the process chamber 201 airtight When the wafer 100 is transported, the substrate support 212 is lowered until the height of the substrate placing surface 211 of the substrate support 212 reaches the substrate loading/unloading port 206 (a wafer transfer position). When the wafer 100 is processed, the substrate support 212 is elevated until the wafer 100 reaches a processing position in the process chamber 201 (a wafer processing position).

The heater 213 is capable of individually controlling the heating of the center region 100a of the wafer 100 and the peripheral region 100b of the center region 100a. The heater 213 includes, for example, a center-zone heater 213a and an outer-zone heater 213b. The center-zone heater 213a is installed at the center of the substrate placing surface 211 and a cylindrical shape in a plan view. The outer-zone heater 213b also has a cylindrical shape in a plan view and is installed at the periphery of the center-zone heater 213a. The center-zone heater 213a heats the center region 100a of the wafer 100, and the outer-zone heater 213b heats the peripheral region 100b of the wafer 100.

The center-zone heater 213a and the outer-zone heater 213b are respectively connected to a heater temperature control unit 215 through heater power supply lines. The heater temperature control unit 215 controls temperatures of the center region 100a and the peripheral region 100b of the wafer 100 by controlling the supply of power to the heaters.

A temperature measuring apparatus 216a and a temperature measuring apparatus 216b, which measure the temperature of the wafer 100, are included in the substrate support 212. The temperature measuring apparatus 216a is installed at a center region of the substrate support 212 to measure a temperature in the vicinity of the center-zone heater 213a. The temperature measuring apparatus 216b is installed at a peripheral region of the substrate support 212 to measure a temperature in the vicinity of the outer-zone heater 213b. The temperature measuring apparatus 216a and the temperature measuring apparatus 216b are connected to a temperature receiving unit 216c. The voltages or the currents detected by the temperature measuring apparatuses 216a and 216b are transmitted to the temperature receiving unit 216c as temperature. The temperature receiving unit 216c transmits the received temperature to a controller 280 to be described later. The controller 280 controls the temperature of the center-zone heater 213a and the outer-zone heater 213b based on the received temperature or pillar width received from a host apparatus 270 to be described later. Also, the temperature measuring apparatus 216a, the temperature measuring apparatus 216b and the temperature receiving unit 216c are collectively referred to as a temperature detecting unit 216.

<Exhaust System>

An exhaust port 221 for exhausting an inner atmosphere of the process chamber 201 is connected to the surface of the inner wall of the process chamber 201 (the upper vessel 202a). An exhaust pipe 224 is connected to the exhaust port 221. A pressure controller 227 such as an APC (Automatic Pressure Controller) that control the inner pressure of the process chamber 201 and a vacuum pump 223 are connected in-line to the exhaust pipe 224 in order. The first exhaust unit (the first exhaust line) includes the exhaust port 221, the exhaust pipe 224 and the pressure controller 227. The first exhaust unit may further include the vacuum pump 223.

<Buffer Chamber>

A buffer chamber 232 is installed above the process chamber 201. The buffer chamber 232 includes side walls 232a and a ceiling 232b. A shower head 234 is embedded in the buffer chamber 232. A gas supply path 235 is disposed between the side walls 232a of the buffer chamber 232 and the shower head 234. That is, the gas supply path 235 is installed to surround side walls 234b of the shower head 234.

Figure 12:
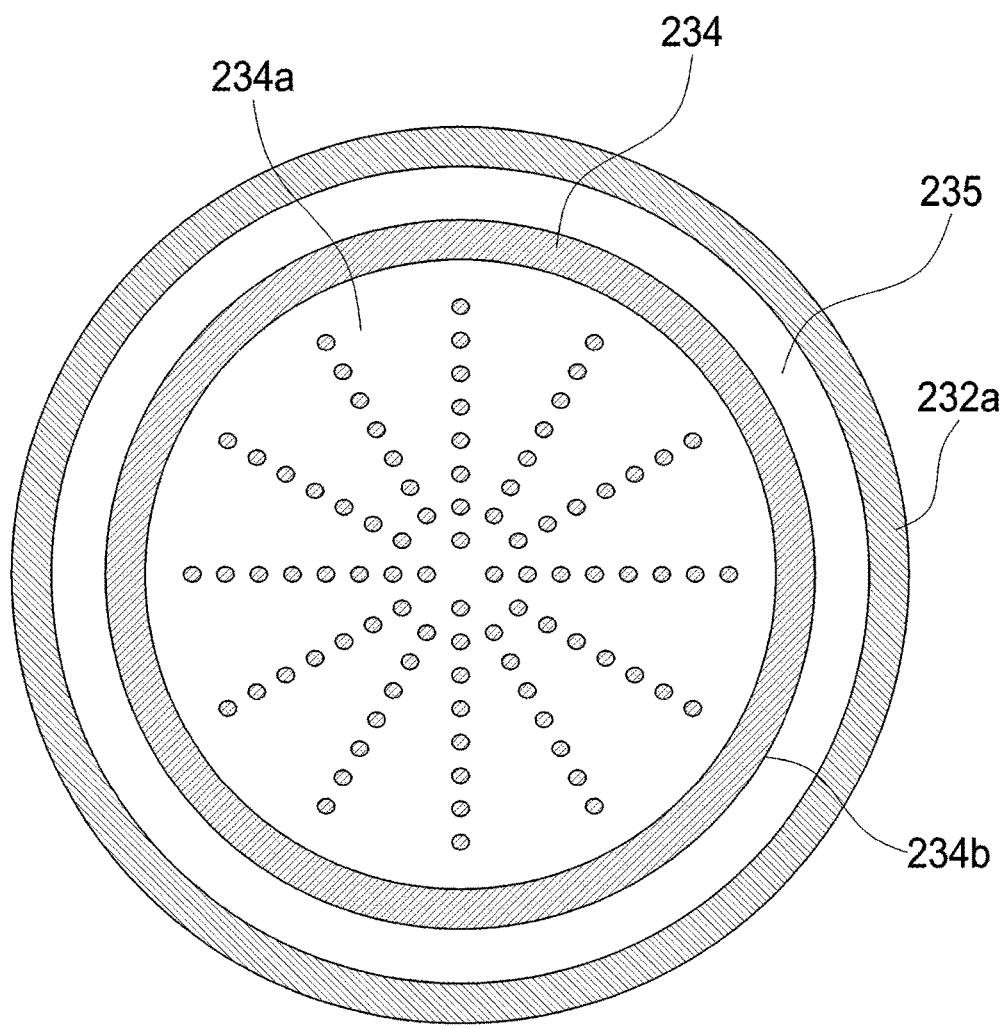
FIG. 12 schematically illustrates a partial cross-section of the substrate processing apparatus according to the embodiment.

A distribution plate 234a is provided at a boundary between the shower head 234 and the process chamber 201. The distribution plate 234a, for example, has a disk shape. When viewed from the processing chamber side, the gas supply path 235 is a structure defined by the side wall 234b and the side wall 232a in the vicinity of the distribution plate 234a in a horizontal direction as shown in FIG. 12.

A gas inlet pipe 236 penetrates the ceiling 232b of the buffer chamber 232. A gas inlet pipe 238 is connected to the shower head 234. The gas inlet pipe 236 and the gas inlet pipe 238 are connected to a second gas supply unit which is described later.

A gas introduced through the gas inlet pipe 236 is supplied into the process chamber 201 through the shower head 234. A gas introduced through the gas inlet pipe 238 is supplied into the process chamber 201 through the gas supply path 235.

The gas supplied through the shower head 234 is supplied to the center of the wafer 100. The gas supplied through the gas supply path 235 is supplied into the edge of the wafer 100. The peripheral region (edge) of the wafer 100 refers to the periphery of the wafer 100 with respect to the center of the wafer 100.

<Gas Supply Unit>

Figure 13:
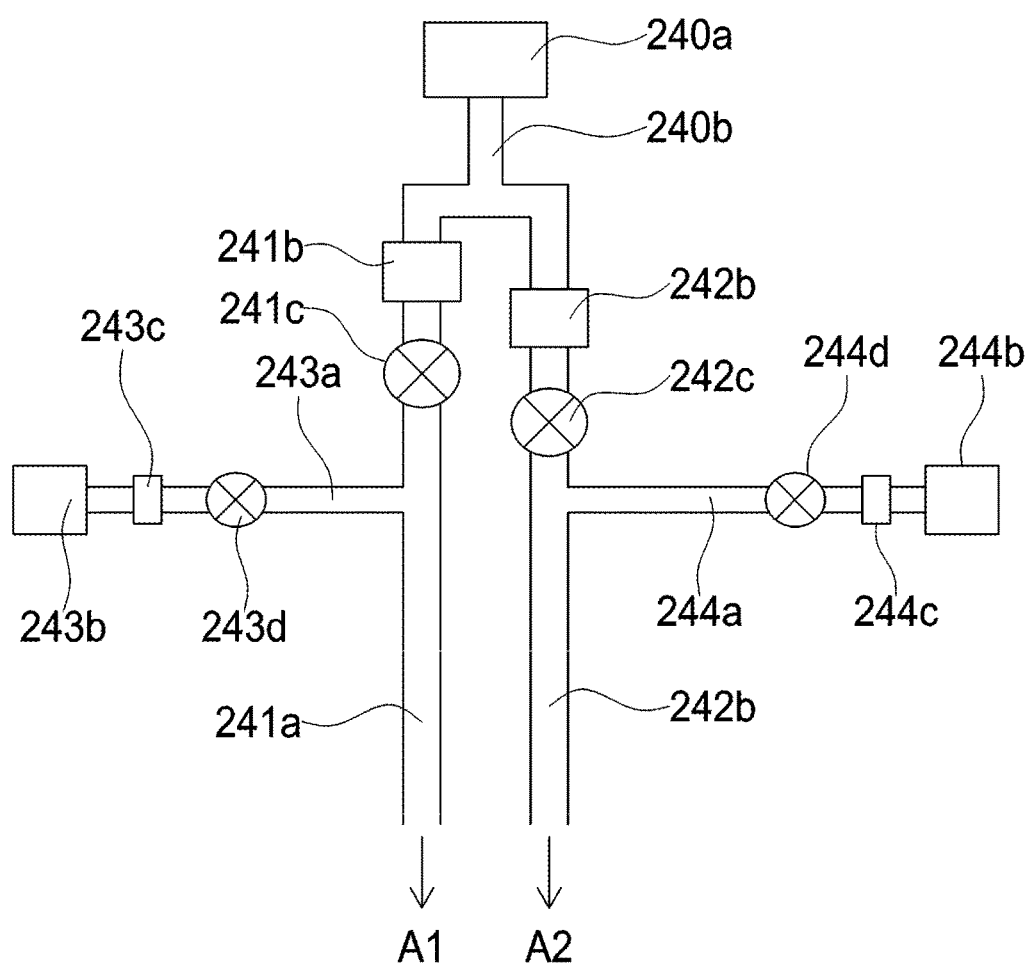
FIG. 13 schematically illustrates a gas supply unit of the substrate processing apparatus according to the embodiment.

Next, the gas supply unit will be described with reference to FIG. 13. A1 of FIG. 13 is connected to A1 of FIG. 11, and A2 of FIG. 13 is connected to A2 of FIG. 11. That is, a gas supply pipe 241a is connected to the gas inlet pipe 236, and a gas supply pipe 242a is connected to the gas inlet pipe 238.

A junction pipe 240b, a mass flow controller 241b and a valve 241c are installed at the gas supply pipe 241a in order from an upstream side to a downstream side of the gas supply pipe 241a. The mass flow controller 241b and the valve 241c control a flow rate of a gas passing through the gas supply pipe 241a. A first process gas source 240a is provided at an upstream side of the junction pipe 240b.

A first process gas (source gas) is one of the process gases. The first process gas includes a first element. In one embodiment, the first element may include silicon (Si), for example. That is, the first process gas may be a silicon-containing gas. Disilane ($Si_2H_6$) gas may be used as the silicon-containing gas. In addition to the disilane gas, the silicon-containing gas may include tetraethyl orthosilicate ($Si(OC_2H_5)_4$, abbreviated as TEOS) gas, tetrakis(dimethylamino)silane ($Si(N(CH_3)_2)_4$, abbreviated as 4DMAS) gas, bis(diethylamino)silane ($Si(N(C_2H_5)_2)_2H_2$, abbreviated as 2DEAS) gas, bis(tertiary-butyl-amino)silane ($SiH_2(NH(C_4H_9))_2$, abbreviated as BTBAS) gas, hexamethyldisilazane ($C_6H_{19}NSi_2$, abbreviated as HMDS) gas, trisilylamine (($SiH_3)_3N$, abbreviated as TSA) gas and hexachlorodisilane ($Si_2Cl_6$, abbreviated as HCDS) gas. The source of the first process gas may be solid, liquid and gas at room temperature and under atmospheric pressure. When the source of the first process gas is in a liquid state at room temperature and under atmospheric pressure, an evaporator (not illustrated) may be provided between the first process gas source and the MFC 241b. In the present embodiment, the source of the first process gas is in a gaseous state.

Preferably, a first inert gas supply pipe 243a configured to supply an inert gas is connected to a downstream side of the valve 241c. An inert gas supply source 243b, a mass flow controller 243c, a valve 243d are installed at the first inert gas supply pipe 243a in order from an upstream side to a downstream side of the first inert gas supply pipe 243a. For example, helium (He) gas is used as the inert gas. The inert gas is added to the gas flowing through the gas supply pipe 241a and is used as a diluting gas. A concentration or a flow rate of the process gas supplied through the gas inlet pipe 236 and the shower head 234 may be optimized by controlling the mass flow controller 243c and the valve 243d.

The gas supply pipe 242a is connected to the gas inlet pipe 238. A junction pipe 240b, a mass flow controller 242b and a valve 242c are installed at the gas supply pipe 242a in order from an upstream side to a downstream side of the gas supply pipe 242a. The mass flow controller 242b and the valve 242c control a flow rate of a gas passing through the gas supply pipe 242a. The first process gas source 240a is installed at the upstream side of the junction pipe 240b.

Preferably, a second inert gas supply pipe 244a configured to supply an inert gas is connected to a downstream side of the valve 242c. An inert gas supply source 244b, a mass flow controller 244c and a valve 244d are installed at the second inert gas supply pipe 244a in order from an upstream side to a downstream side of the second inert gas supply pipe 244a. For example, helium (He) gas is used as the inert gas. The inert gas is added to the gas flowing through the gas supply pipe 242a and is used as a diluting gas. A concentration or a flow rate of the gas flowing through the gas inlet pipe 238 and the gas supply path 235 may be optimized by controlling the mass flow controller 244c and the valve 244d.

The gas supply pipe 241a, the mass flow controller 241b, the valve 241c, the gas supply pipe 242a, the mass flow controller 242b, the valve 242c and the junction pipe 240b are collectively referred to as the gas supply unit. Also, the first process gas source 240a, the gas inlet pipe 236 and the gas inlet pipe 238 may be included in the gas supply unit.

The first inert gas supply pipe 243a, the mass flow controller 243c, the valve 243d, the second inert gas supply pipe 244a, the mass flow controller 244c and the valve 244d are collectively referred to as a first inert gas supply unit. Also, the inert gas supply source 243b and the inert gas supply source 244b may be included in the first inert gas supply unit. Also, the gas supply unit may include the first inert gas supply unit.

As described above, since the mass flow controllers 241b and 242b and the valves 241c and 242c are installed in the gas supply unit, the amounts of the gases may by individually controlled. Also, since the mass flow controllers 243c and 244c and the valves 243d and 244d are installed in the first inert gas supply unit and the second inert gas supply unit, the concentrations of the inert gases may by individually controlled.

<Controller>

The substrate processing apparatus 900 includes a controller 280 configured to control components of the substrate processing apparatus 900.

Figure 14:
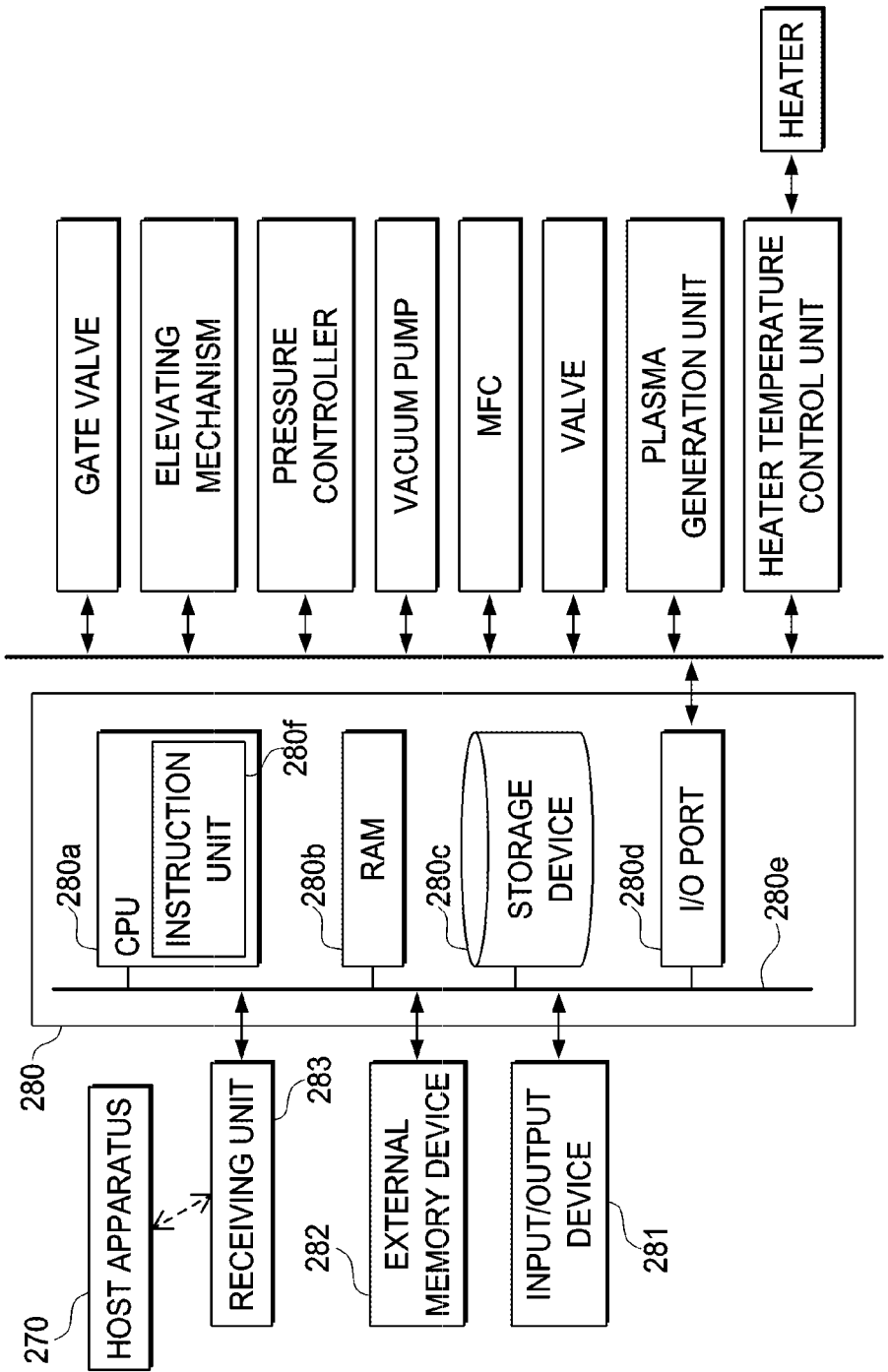
FIG. 14 schematically illustrates a controller and peripherals thereof of the substrate processing apparatus according to the embodiment.
Figure 15:
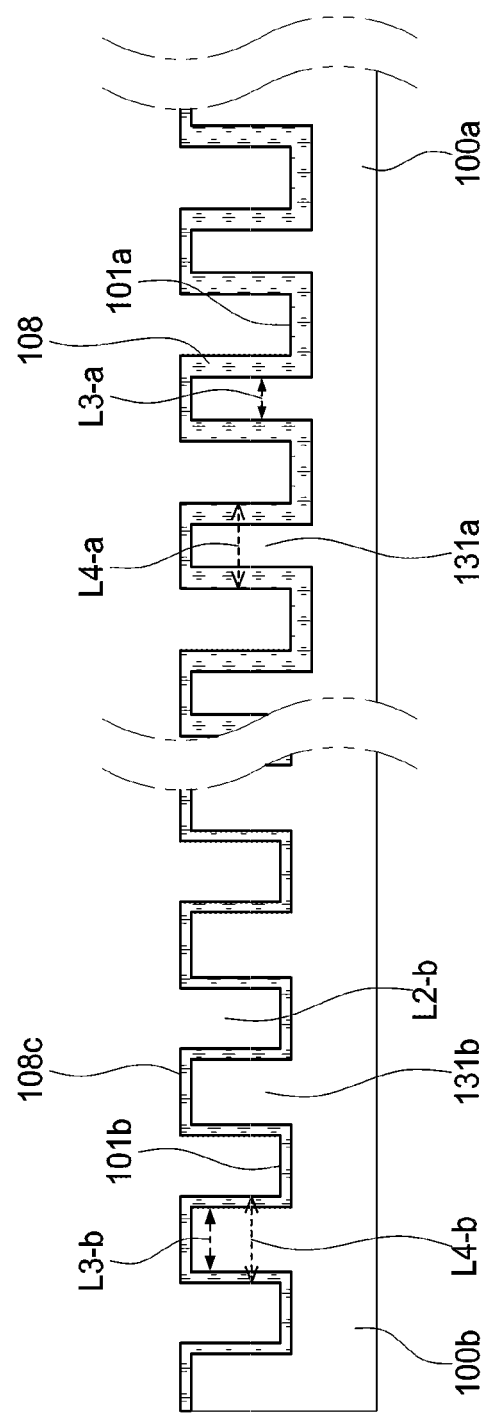
FIG. 15 illustrates a cross-section of the wafer having thereon an oxidized width adjusting film according to the embodiment.

FIG. 14 schematically illustrates the configuration of the controller 280. The controller 280, which is the control unit, may be embodied by a computer having a CPU (Central Processing Unit) 280a, a RAM (Random Access Memory) 280b, a storage device 280c and an I/O port 280d. The RAM 280b, the storage device 280c and the I/O port 280d may exchange data with the CPU 280a via an internal bus 280e. The CPU (280a) may include an instruction unit 280f which is configured to instruct the components of the substrate processing apparatus 900 to transmit and receive the information among the components. An input/output device 281 such as a touch panel and an external memory device 282 may be connected to the controller 280. Also, a receiving unit 283 is installed which is electrically connected to the host apparatus 270 through a network. The receiving unit 283 is configured to be capable of receiving information on the other apparatus from the host apparatus 270.

The storage device 280c may be embodied by components such as flash memory and HDD (Hard Disk Drive). A control program for controlling the operation of the substrate processing apparatus and a program recipe in which information such as the order and condition of the substrate processing is stored are readably stored in the storage device 280c. A process recipe is a program that is executed in the controller 280 to obtain a predetermined result by performing sequences of the substrate processing. Hereinafter, the program recipe, the process recipe and the control program are collectively referred to simply as a program. The term "program" may refer to only the program recipe, only the control program, or both. The RAM 280b is a work area in which the program or the data read by the CPU 280a are temporarily stored.

The I/O port 280d is connected to the components such as the gate valve 205, the elevating mechanism 218, the heater 213, the pressure controllers 222 and the vacuum pump 223. The I/O port 280d may be connected to the components such as the MFCs 241b, 242b, 243c and 244c and the valves 241c, 242c, 243d and 244d.

The CPU 280a is configured to read and execute the control program stored in the storage device 280c, and read the process recipe in accordance with an instruction such as an operation command inputted from the input/output device 281. The CPU 280a may be configured to perform operations such as opening and closing operations of the gate valve 205, operations of the elevating mechanism 218, the power supply to the heater 213, pressure adjusting up and down operation of the pressure controllers 222, an ON/OFF operation of the vacuum pumps 223, flow rate adjusting operations of the MFCs 241b, 242b and 243c, and operations of the valves 241c, 242c, 243d and 244d.

The controller 280 may be embodied by a dedicated computer or a general purpose computer. The controller 280 of the embodiment may be embodied by preparing the external memory device 282 (e.g. magnetic tapes, magnetic disks such as flexible disk and hard disk, optical disks such as CD and DVD, magneto-optical disks such as MO, and semiconductor memories such as USB memory and memory card) and installing the program on the general purpose computer using the external memory device 282. The method of providing the program to the computer is not limited to the external memory device 282. The program may be directly provided to the computer using a communication means such as a network (Internet or dedicated line) without the external memory device 282. The storage device 280c or the external memory device 282 may be embodied by a computer-readable recording medium. Hereinafter, the storage device 280c or the external memory device 282 may be collectively referred to as recording medium. Hereinafter, the term "recording medium" may refer to only the storage device 280c, only the external memory device 282, or both.

Although the receiving unit 283 of the present embodiment receives the information of other apparatuses from the host apparatus 270, the present embodiment is not limited thereto. For example, the information may be directly received from the other apparatuses. Also, the information of the other apparatuses may be inputted through the input and output device 281 and the components may be controlled based on the inputted the information. Also, the information of the other apparatuses may be stored in the external memory device 282, and the information of the other apparatuses may be received from the external memory device 282.

Next, a method of forming the width adjusting film 107 using the substrate processing apparatus 900 will be described. After the pillar width measuring step S110, the wafer 100 is loaded into the substrate processing apparatus 900. Also, in the description below, the controller 280 is configured to control the operations of the components of the substrate processing apparatus 900.

<Substrate Loading Step>

After the pillar width or the distribution thereof is measured in the pillar width measuring step S110, the wafer 100 is loaded into the substrate processing apparatus 900.

<Depressurization and Temperature Rising Step>

Next, the process chamber 201 is exhausted through the exhaust pipe 224 of the process chamber 201 until the inner pressure of the process chamber 201 reaches a predetermined level (vacuum level). At this time, the amount of current applied to the heater 213 is feedback-controlled based on the temperature detected by a temperature sensor 216 until the inner temperature of the process chamber 201 reaches a predetermined temperature. Specifically, the substrate support unit 210 is pre-heated by the heater 213 until the temperature of the wafer 100 or the temperature of the substrate support unit 210 is stable.

When the wafer 100 is placed on the substrate support unit 210 and the inner atmosphere of process chamber 201 is stabilized, the controller 280 operates the mass flow controllers 241b and 242b, and adjusts degrees of openings of the valves 241c and 242c. In this case, the controller 280 may operate the mass flow controllers 243c and 244c, and may adjust degrees of openings of the valves 243d and 244d.

<Gas Supply Step>

In the gas supply step, gases are supplied into the process chamber 201 for a predetermined time duration by the gas supply unit.

When the gas is supplied, the controller 280 controls an amount (or a concentration) of the process gas supplied to the center region 100a of the wafer 100 and an amount (or a concentration) of the process gas supplied to the peripheral region 100b by controlling the mass flow controllers or the valves of the gas supply unit based to the distribution of the pillar width L3 received from the host apparatus 270. More preferably, the controller 280 controls the center-zone heater 213a and the outer-zone heater 213b according to the data received from the host apparatus 270 to control a temperature distribution of the wafer 100.

The gases supplied into the process chamber 201 are decomposed in the process chamber, and the width adjusting film 107 is then formed in the grooves 101.

After a predetermined time has elapsed, the controller 280 controls the valves to close to stop the supply of the gases.

At this time, the temperature of the heater 213 is set to a temperature such that there isn't any adverse effect on pre-formed structures on the wafer 100. For example, the controller 280 is configured to control the temperature of the heater 213 such that the temperature of the wafer 100 ranges from 300° C. to 450° C.

Instead of the helium gas, gases that do not have any adverse effect may be used as the inert gas. For example, rare gases such as argon (Ar) gas, nitrogen ($N_2$) gas, neon (Ne) gas and xenon (Xe) gas may be used as the inert gas as well as helium (He) gas.

<Substrate Unloading Step>

After the gas supply step is completed, the gate valve 205 is opened and the wafer 100 is unloaded from the process chamber 201 through the gate valve 205.

Next, a method of controlling the thickness of the width adjusting film 107 using the substrate processing apparatus 900 will be described. As described above, the widths of the pillars 131 are different in the center region 100a and the peripheral region 100b of the wafer 100. In the pillar width measuring step S110, the widths of the pillars 131 (or the distribution thereof) are measured. The measured distribution is stored in the RAM 280b via the host apparatus 270. The recipe stored in storage device 280c for processing the wafer 100 is selected according to the stored distribution. The substrate processing apparatus 900 operates based on the selected recipe to adjust the thickness distribution.

Next, an example wherein the distribution stored in the RAM 280b is the distribution D will be described.

The distribution D indicates that the pillar 131a in the center region 100a is narrower than the pillar 131b in the peripheral region 100b. As shown in FIG. 10, in case of the distribution D, the components of the substrate processing apparatus 900 are controlled such that the width adjusting film 107a formed in the center region 100a of the wafer 100 in the width adjusting film forming step S112 is thicker than the width adjusting film 107b formed in the peripheral region 100b. More specifically, When the gas supply unit is controlled such that the amount of silicon-containing gas supplied to the peripheral region 100b of the wafer 100 is smaller than the amount of the silicon-containing gas supplied to the center region 100a of the wafer 100, the width L4, which is the sum of the width of the pillar 131 (or the area of the active region 130 of the semiconductor device) and the thickness of the adjusting film 107, may be maintained within a predetermined range. In other words, the width L4, which is the sum of the width of the pillar 131 and the thickness of the width adjusting film 107, is substantially the same in the center region 100a and the peripheral region 100b.

At this time, the amount of silicon-containing gas supplied to the process chamber 201 through the shower head 234 is adjusted by controlling the mass flow controller 241b and the opening degree of the valve 241c of the gas supply unit. The amount of silicon-containing gas supplied to the process chamber 201 through the gas supply path 235 is adjusted by controlling the mass flow controller 242b and the opening degrees of the valve 242c.

The amount of exposure to the silicon-containing gas per unit area of the processing surface of the wafer 100 is adjusted such that the amount of exposure to the silicon-containing gas supplied through the gas supply path 235 is smaller than the amount of exposure to the silicon-containing gas supplied through the shower head 234. Herein, "amount of exposure" refers to the amount of exposure to the main component of the process gas. In the embodiment, the process gas is a silicon-containing gas and its main component is silicon.

The silicon-containing gas supplied via the shower head 234 is supplied onto the center region 100a of the wafer 100. By supplying the silicon-containing gas, the width adjusting film 107a is formed on the surface of the groove 101a as shown in FIG. 10.

The silicon-containing gas supplied via the gas supply path 235 is supplied onto the peripheral region 100b of the wafer 100. By supplying the silicon-containing gas, the width adjusting film 107b is formed on the surface of the groove 101b as shown in FIG. 10.

As described above, since the amount of exposure to the silicon-containing gas per unit area of the center region 100a of the wafer 100 is greater than the amount of exposure to the silicon-containing gas per unit area of the peripheral region 100b of the wafer 100, the width adjusting film 107a is thicker than the width adjusting film 107b.

Figure 10:
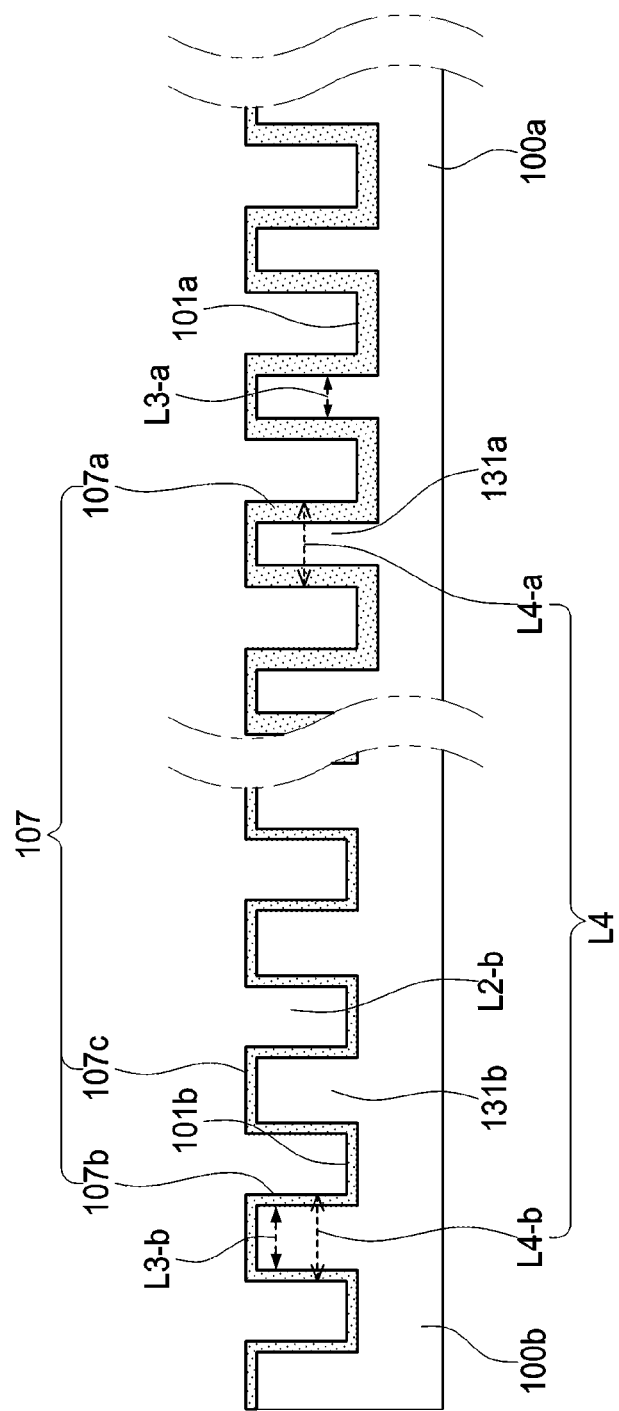
FIG. 10 illustrates a cross-section of the wafer having thereon a width adjusting film according to the embodiment.

As shown in FIG. 10, the width adjusting film 107 is formed such that a width (L4-a) which is the sum of the pillar width L3-a and the thickness of the width adjusting film 107a in the center region 100a of the wafer 100 is substantially the same as a width (L4-b) which is the sum of the pillar width L3-b and the thickness of the width adjusting film 107b in the peripheral region 100b of the wafer 100. In other words, the difference between the width L4-a and the width L4-b is within a predetermined range that does not affect the uniformity of the active region.

Alternatively, the concentrations of the silicon-containing gas supplied through the gas supply pipe 241a and the gas supply pipe 242a may be individually adjusted while maintaining the amount of silicon-containing gas supplied through the gas supply pipe 241a to be the same as the amount of the silicon-containing gas supplied through the gas supply pipe 242a. For example, by controlling the first inert gas supply unit, the concentration of the silicon-containing gas supplied through the gas supply pipe 241a and the concentration of the silicon-containing gas supplied through the gas supply pipe 242a may be individually adjusted. Specifically, in case of the distribution D, the first inert gas supply unit may be controlled such that the concentration of the silicon-containing gas supplied through the gas supply pipe 241a is greater than the concentration of the silicon-containing gas supplied through the gas supply pipe 242a.

Thus, the amount of silicon-containing gas supplied through the gas supply path 235 may be adjusted to be smaller than the amount of silicon-containing gas supplied through the shower head 234 such that the amount of exposure to the silicon-containing gas per unit area of the processing surface of the wafer 100 may be precisely controlled. By adjusting the amount of exposure in this manner, the width adjusting film 107a may be formed thicker than the width adjusting film 107b.

More preferably, the concentration of the silicon-containing gas being supplied through the gas supply pipe 241a may be adjusted to be different from the concentration of the silicon-containing gas supplied through the gas supply pipe 242a while adjusting the amount of the silicon-containing gas supplied through the gas supply pipe 241a to be different from the amount of silicon-containing gas supplied through the gas supply pipe 242a. By simultaneously adjusting the amount and the concentration of the silicon-containing gases in this manner, the difference between the amount of exposure of per unit area of the center region 100a of the wafer 100 to the silicon-containing gas and the amount of exposure of per unit area of the peripheral region 100b of the wafer 100 may be increased. That is, the difference between the thickness of the adjusting film 107a and the thickness of the adjusting film 107b may be increased.

More preferably, the center-zone heater 213a and the outer-zone heater 213b may be controlled simultaneously with the adjustment of the process gas described above. Since the thickness of the width adjusting film 107 is proportional to the temperature, the center-zone heater 213a and the outer-zone heater 213b may be controlled such that the temperature of the outer-zone heater 213b is lower than the temperature of the center-zone heater 213a in case of the distribution D. Since the efficiency of the formation of the width adjusting film 107 using a gas such as a disilane gas is greatly affected by the temperature, it is preferable that the center-zone heater 213a and the outer-zone heater 213b are controlled as described above.

By adjusting the amount (or concentration) of supplied process gas and the temperature, the thickness of the width adjusting film 107 may be adjusted more precisely.

Next, an example wherein the distribution stored in the RAM 280b is the distribution C will be described. The distribution C indicates that the pillar 131a in the center region 100a is wider than the pillar 131a in the peripheral region 100b as shown in FIG. 9.

In case of the distribution C, the components of the substrate processing apparatus 900 are controlled such that the width adjusting film 107b formed in the peripheral region 100b is thicker than the width adjusting film 107a formed in the center region 100a of the wafer 100 in the width adjusting film forming step S112. More specifically, When the gas supply unit is controlled such that the amount of the silicon-containing gas supplied to the center region 100a of the wafer 100 is smaller than the amount of silicon-containing gas supplied to the peripheral region 100b of the wafer 100, the width L4, which is the sum of the width of the pillar 131 (or the area of the active region 130 of the semiconductor device) and the thickness of the adjusting film 107, may be maintained within a predetermined range. In other words, the width L4, which is the sum of the width of the pillar 131 and the thickness of the width adjusting film 107, is substantially the same in the center region 100a and the peripheral region 100b.

At this time, the amount of silicon-containing gas supplied to the process chamber 201 through the shower head 234 is adjusted by controlling the mass flow controller 241*b* and the opening degree of the valve 241*c* of the gas supply unit. The amount of silicon-containing gas supplied to the process chamber 201 through the gas supply path 235 is adjusted by controlling the mass flow controller 242*b* and the opening degrees of the valve 242*c*.

The amount of exposure to the silicon-containing gas per unit area of the processing surface of the wafer 100 is adjusted such that the amount of exposure to the silicon-containing gas supplied through the shower head 234 is smaller than the amount of exposure to the silicon-containing gas supplied through the gas supply path 235.

The silicon-containing gas supplied via the shower head 234 is supplied onto the center region 100*a* of the wafer 100. By supplying the silicon-containing gas, the width adjusting film 107*a* is formed on the surface of the groove 101*a*.

The silicon-containing gas supplied via the gas supply path 235 is supplied onto the peripheral region 100*b* of the wafer 100. By supplying the silicon-containing gas, the width adjusting film 107*b* is formed on the surface of the groove 101*b*.

As described above, since the amount of exposure to the silicon-containing gas per unit area of the center region 100*a* of the wafer 100 is smaller than the amount of exposure to the silicon-containing gas per unit area of the peripheral region 100*b* of the wafer 100, the width adjusting film 107*b* is thicker than the width adjusting film 107*a*.

Alternatively, the concentrations of the silicon-containing gas supplied through the gas supply pipe 241*a* and the gas supply pipe 242*a* may be individually adjusted while maintaining the amount of silicon-containing gas supplied through the gas supply pipe 241*a* to be the same as the amount of the silicon-containing gas supplied through the gas supply pipe 242*a*.

Thus, the amount of silicon-containing gas supplied through the shower head 234 may be adjusted to be smaller than the amount of silicon-containing gas supplied through the gas supply path 235 such that the amount of exposure to the silicon-containing gas per unit area of the processing surface of the wafer 100 may be precisely controlled. By adjusting the amount of exposure in this manner, the width adjusting film 107*b* may be formed thicker than the width adjusting film 107*a*.

More preferably, similar to the distribution D, the concentration of the silicon-containing gas being supplied through the gas supply pipe 241*a* may be adjusted to be different from the concentration of the silicon-containing gas supplied through the gas supply pipe 242*a* while adjusting the amount of the silicon-containing gas supplied through the gas supply pipe 241*a* to be different from the amount of silicon-containing gas supplied through the gas supply pipe 242*a*.

More preferably, the center-zone heater 213*a* and the outer-zone heater 213*b* may be controlled simultaneously with the adjustment of the process gas described above. Since the thickness of the width adjusting film 107 is proportional to the temperature, the center-zone heater 213*a* and the outer-zone heater 213*b* may be controlled such that the temperature of the center-zone heater 213*a* is lower than the temperature of the outer-zone heater 213*b* in case of the distribution C. Since the efficiency of the formation of the width adjusting film 107 using a gas such as a disilane gas is greatly affected by the temperature, it is preferable that the center-zone heater 213*a* and the outer-zone heater 213*b* are controlled as described above.

By adjusting the amount (or concentration) of supplied process gas and the temperature, the thickness of the width adjusting film 107 may be adjusted more precisely.

As described above, by adjusting (tuning) the amount of silicon-containing gas supplied to per unit area of the processing surface of the wafer 100, the thickness of the width adjusting film may be individually adjusted in the center region 100*a* and the peripheral region 100*b* of the wafer 100.

<Modifying Step S114>

Next, referring back to FIG. 1, a modifying step S114 will be described. In the modifying step S114, the width adjusting film 107 is modified. According to the embodiment, the modification of the width adjusting film 107 refers to an oxidation process.

The wafer 100 processed in the substrate processing apparatus 900 is transported to a modifying apparatus (not shown). The modifying apparatus is, for example, a plasma processing apparatus. In the modifying apparatus, the surface of the width adjusting film 107 is oxidized by supplying an oxygen-containing gas such as oxygen in a plasma state onto the wafer 100. The oxidized width adjusting film 107 referred to as modified oxide film 108 in FIG. 15. The flow of leakage current through the active region 130 or the pillar 131 may be prevented by oxidizing the surface of the width adjusting film 107. After performing the oxidation process, a portion 108*c* of the modified oxide film 108 that is not in the grooves 101 is removed by polishing using a polishing apparatus (not shown).

<Impurity Doping Step S116>

Next, an impurity doping step S116 will be described. In the impurity doping step S116, the wafer 100 is transported to the impurity doping apparatus (not shown), and the upper surface of the width adjusting film 107 is doped with impurities such as phosphorus (P) and arsenic (As) to form the plug contact region 133 also referred to as second plug contact region 133. Since the sum of the first plug contact regions 132 is substantially the same as that of the second plug contact regions 133 at the surface of the wafer 100, the deviation in the area of the plug contact region may be suppressed.

Figure 16:
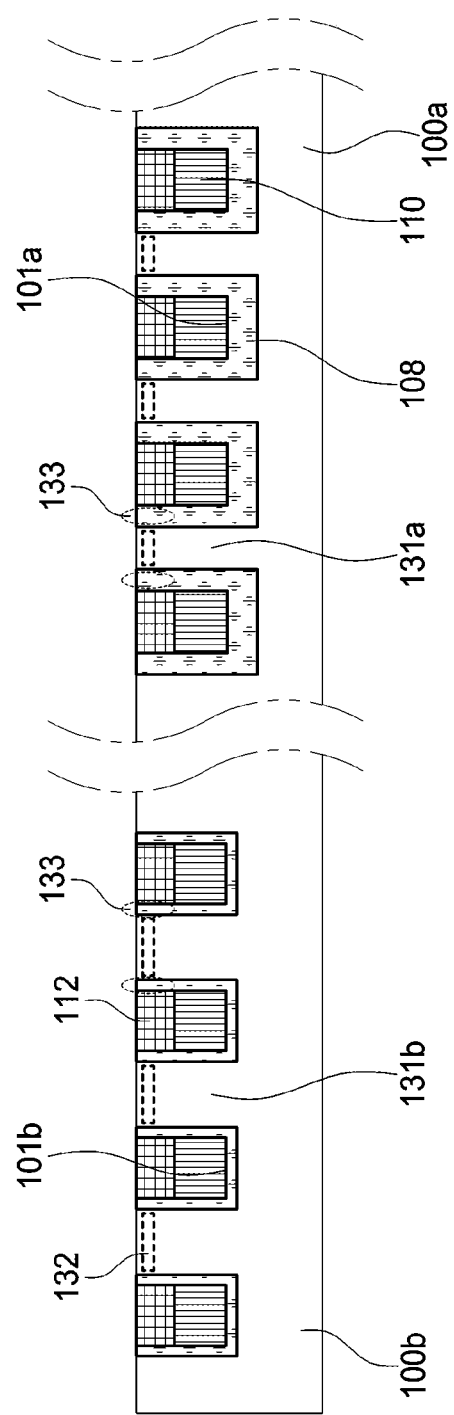
FIG. 16 illustrates a cross-section of the wafer having a second plug contact region according to the embodiment.

While the second plug contact region 133 is formed on a portion of the modified oxide film 108 in FIG. 16, the technique described herein is not limited thereto. The second plug contact region 133 may also be formed on other portions of the modified oxide film 108.

While the impurity doping step S116 is performed after the modifying step S114, the technique described herein is not limited thereto. For example, the impurity doping step S116 may be performed between the width adjusting film forming step S112 and the modifying step 114.

<Groove Filling Step S118>

Next, a groove filling step S118 will be described. In the groove filling step S118, word-line 110 and cap insulating film 112 are formed on the on the modified oxide film 108 formed in the groove 101 and on the inner surface of the groove 101. The steps for forming the $0^{th}$ layer, i.e. from the hard mask forming step S102 to the groove filling step S118, are collectively referred to as $0^{th}$ layer forming step.

After the layer M-0 is formed as described above, layer M-1 and layer M-2 are formed on the layer M-0 as shown in FIG. 18.

According to the embodiment described above, the following main effects are provided.

(A) Since the deviation of the area of the plug contact region may be suppressed, the uniform electrical resistance of the contact region in the semiconductor device may be obtained, thereby improving the.

(B) The doped regions are also uniform.

According to the technique described herein, the deviation of the characteristic of the semiconductor device may be suppressed.

What is claimed is:

1. A method of manufacturing a semiconductor device comprising:
    (a) receiving a data obtained by measuring a width of a first pillar between first grooves in a center region of a substrate and a width of a second pillar between second grooves in a peripheral region of the substrate; and
    (b) forming a width adjusting film on surfaces of the first grooves and the second grooves such that:
    a sum of the width of the first pillar and a thickness of a first portion of the width adjusting film in the center region forms a width of a third pillar; and
    a sum of the width of the second pillar and a thickness of a second portion of the width adjusting film in the peripheral region forms a width of a fourth pillar,
    wherein a difference between the width of the third pillar and the width of the fourth pillar are within a predetermined range such that a pillar width uniformity of an active region is not affected.

2. The method according to claim 1, further comprising:
(c) oxidizing the width adjusting film after performing (b).

3. The method according to claim 2, further comprising:
(d) doping an upper surface of the width adjusting film with an impurity after performing (c).

4. The method according to claim 3, wherein (b) comprises forming the width adjusting film by supplying a process gas to the substrate such that an amount of exposure to a main component of the process gas per unit area of the substrate in the peripheral region is smaller than an amount of exposure to the main component of the process gas per unit area of the substrate in the center region when the width of the second pillar is greater than the width of the first pillar, and that the amount of exposure to the main component of the process gas per unit area of the substrate in the peripheral region is greater than the amount of exposure to the main component of the process gas per unit area of the substrate in the center region when the width of the second pillar is smaller than the width of the first pillar.

5. The method according to claim 4, wherein (b) comprises forming the width adjusting film while adjusting a temperature distribution of the substrate such that a temperature of the center region is higher than a temperature of the peripheral region when the width of the second pillar is greater than the width of the first pillar, and that the temperature of the peripheral region is higher than the temperature of the center region when the width of the second pillar is smaller than the width of the first pillar.

6. The method according to claim 3, wherein (b) comprises forming the width adjusting film while adjusting a temperature distribution of the substrate such that a temperature of the center region is higher than a temperature of the peripheral region when the width of the second pillar is greater than the width of the first pillar, and that the temperature of the peripheral region is higher than the temperature of the center region when the width of the second pillar is smaller than the width of the first pillar.

7. The method according to claim 2, wherein (b) comprises forming the width adjusting film by supplying a process gas to the substrate such that an amount of exposure to a main component of the process gas per unit area of the substrate in the peripheral region is smaller than an amount of exposure to the main component of the process gas per unit area of the substrate in the center region when the width of the second pillar is greater than the width of the first pillar, and that the amount of exposure to the main component of the process gas per unit area of the substrate in the peripheral region is greater than the amount of exposure to the main component of the process gas per unit area of the substrate in the center region when the width of the second pillar is smaller than the width of the first pillar.

8. The method according to claim 7, wherein (b) comprises forming the width adjusting film while adjusting a temperature distribution of the substrate such that a temperature of the center region is higher than a temperature of the peripheral region when the width of the second pillar is greater than the width of the first pillar, and that the temperature of the peripheral region is higher than the temperature of the center region when the width of the second pillar is smaller than the width of the first pillar.

9. The method according to claim 2, wherein (b) comprises forming the width adjusting film while adjusting a temperature distribution of the substrate such that a temperature of the center region is higher than a temperature of the peripheral region when the width of the second pillar is greater than the width of the first pillar, and that the temperature of the peripheral region is higher than the temperature of the center region when the width of the second pillar is smaller than the width of the first pillar.

10. The method according to claim 1, wherein (b) comprises forming the width adjusting film by supplying a process gas to the substrate such that an amount of exposure to a main component of the process gas per unit area of the substrate in the peripheral region is smaller than an amount of exposure to the main component of the process gas per unit area of the substrate in the center region when the width of the second pillar is greater than the width of the first pillar, and that the amount of exposure to the main component of the process gas per unit area of the substrate in the peripheral region is greater than the amount of exposure to the main component of the process gas per unit area of the substrate in the center region when the width of the second pillar is smaller than the width of the first pillar.

11. The method according to claim 10, wherein (b) comprises forming the width adjusting film while adjusting a temperature distribution of the substrate such that a temperature of the center region is higher than a temperature of the peripheral region when the width of the second pillar is greater than the width of the first pillar, and that the temperature of the peripheral region is higher than the temperature of the center region when the width of the second pillar is smaller than the width of the first pillar.

12. The method according to claim 1, wherein (b) comprises forming the width adjusting film while adjusting a temperature distribution of the substrate such that a temperature of the center region is higher than a temperature of the peripheral region when the width of the second pillar is greater than the width of the first pillar, and that the temperature of the peripheral region is higher than the temperature of the center region when the width of the second pillar is smaller than the width of the first pillar.

13. A method of manufacturing a semiconductor device comprising:
    (a) measuring a width of a first pillar between first grooves in a center region of a substrate and a width of a second pillar between second grooves in a peripheral region of the substrate; and
    (b) forming a width adjusting film on surfaces of the first grooves and the second grooves such that a sum of the width of the first pillar and a thickness of a first portion of the width adjusting film in the center region forms a width of a third pillar; and a sum of the width of the second pillar and a thickness of a second portion of the width adjusting film in the peripheral region forms a width of a fourth pillar, wherein a difference between the width of the third pillar and the width of the fourth pillar are within a predetermined range such that a pillar width uniformity of an active region is not affected.

* * * * *